United States Patent
Wu et al.

(10) Patent No.: US 10,931,085 B2
(45) Date of Patent: Feb. 23, 2021

(54) SUPER STRUCTURE GRATING AND TUNABLE LASER

(71) Applicant: Huawei Technologies Co., Ltd., Shenzhen (CN)

(72) Inventors: Lin Wu, Wuhan (CN); Hongmin Chen, Wuhan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/656,219

(22) Filed: Oct. 17, 2019

(65) Prior Publication Data
US 2020/0052467 A1 Feb. 13, 2020

Related U.S. Application Data

(63) Continuation of application No. PCT/CN2017/112142, filed on Nov. 21, 2017.

(30) Foreign Application Priority Data

Apr. 17, 2017 (CN) .......................... 201710247396.3

(51) Int. Cl.
*H01S 5/50* (2006.01)
*H01S 5/12* (2021.01)
(Continued)

(52) U.S. Cl.
CPC ............ *H01S 5/5072* (2013.01); *H01S 5/124* (2013.01); *H04B 10/25891* (2020.05); *H04B 10/503* (2013.01)

(58) Field of Classification Search
CPC .......... H01S 5/5072; H01S 5/124; H01S 5/06; H01S 5/0607; H04B 10/25891;
(Continued)

(56) References Cited

U.S. PATENT DOCUMENTS 4,468,766 A * 8/1984 Spezio .................. G01R 23/17
359/326
5,715,271 A 2/1998 Huang et al.
(Continued)

FOREIGN PATENT DOCUMENTS

CN 1869747 A 11/2006
CN 101022206 A 8/2007
(Continued)

OTHER PUBLICATIONS

Ishii et al., "Quasicontinuous Wavelength Tuning in Super-Structure-Grating (SSG) DBR Lasers", IEEE Journal of Quantum Electronics, vol. 32, No. 3, Mar. 1996, pp. 433-441 (Year: 1996).*
(Continued)

*Primary Examiner* — Tanya T Motsinger
(74) *Attorney, Agent, or Firm* — Conley Rose, P.C.

(57) ABSTRACT

A super structure grating spatially performs amplitude and phase modulation on a uniform grating using a modulation function to generate a comb reflection spectrum. (N+1) modulation function discrete values are obtained after discretization processing is performed on the modulation function using N thresholds. Each of the (N+1) modulation function discrete values corresponds to one section of optical waveguide whose refractive index is uniform or corresponds to one section of the uniform grating. A reflectivity and a full width half maximum (FWHM) of a reflection peak of the super structure grating is adjusted based on a relationship of a ratio of a length of an optical waveguide corresponding to at least one of the (N+1) modulation function discrete values to a total grating length of the super structure grating, and based on the total grating length of the super structure grating.

20 Claims, 14 Drawing Sheets

(51) Int. Cl.
*H04B 10/50* (2013.01)
*H04B 10/25* (2013.01)

(58) Field of Classification Search
CPC .............. H04B 10/503; G02B 5/1871; G02B 27/0012; G02B 5/1814; G02B 5/18
See application file for complete search history.

(56) References Cited

U.S. PATENT DOCUMENTS

| | | |
|---|---|---|
| 6,141,370 A | 10/2000 | Avrutsky et al. |
| 2003/0007524 A1 | 1/2003 | Gotoda |
| 2004/0125833 A1 | 7/2004 | Sarlet et al. |
| 2004/0174915 A1* | 9/2004 | Sarlet ............... H01S 5/06256 372/20 |
| 2004/0252944 A1 | 12/2004 | Hashimoto et al. |
| 2005/0063430 A1 | 3/2005 | Doucet et al. |
| 2006/0051022 A1* | 3/2006 | Levner ............... G02B 6/29322 385/37 |
| 2008/0089698 A1* | 4/2008 | Jiang ................... H04B 10/508 398/189 |
| 2008/0123701 A1* | 5/2008 | He ....................... H01S 5/1032 372/23 |
| 2008/0232411 A1* | 9/2008 | Reid ..................... H01S 5/125 372/20 |
| 2010/0272133 A1 | 10/2010 | Kato |
| 2012/0027041 A1 | 2/2012 | Yamazaki |
| 2012/0057079 A1* | 3/2012 | Dallesasse ........... H01S 5/0261 348/724 |
| 2012/0057610 A1* | 3/2012 | Dallesasse ............. H01S 5/141 372/20 |
| 2012/0063484 A1* | 3/2012 | Goddard ................ H01S 5/142 372/94 |
| 2012/0320939 A1* | 12/2012 | Baets .................... H01S 5/1032 372/45.01 |
| 2013/0176621 A1 | 7/2013 | Miller et al. |
| 2014/0010248 A1 | 1/2014 | Larson |
| 2014/0348187 A1* | 11/2014 | Chen ..................... H01S 5/1209 372/20 |
| 2015/0288140 A1* | 10/2015 | Davies ................ H01S 5/06256 372/33 |
| 2016/0157721 A1* | 6/2016 | Vakoc ................ G01B 9/02008 372/20 |
| 2018/0026426 A1* | 1/2018 | Kawakita ............... G02B 5/284 372/20 |
| 2019/0052367 A1* | 2/2019 | Esman .................. H04B 10/532 |
| 2019/0386749 A1* | 12/2019 | Lezec .................... G02B 1/002 |
| 2020/0076155 A1* | 3/2020 | Wu ....................... H01S 5/02461 |

FOREIGN PATENT DOCUMENTS

| | | |
|---|---|---|
| CN | 101794952 A | 8/2010 |
| CN | 102074892 B | 2/2012 |
| CN | 102412504 A | 4/2012 |
| CN | 102646926 A | 8/2012 |
| CN | 103219649 A | 7/2013 |
| CN | 103532009 A | 1/2014 |
| CN | 104104011 A | 10/2014 |
| JP | 2001007439 A | 1/2001 |
| JP | 2003017803 A | 1/2003 |
| JP | 2007532980 A | 11/2007 |
| JP | 2010258297 A | 11/2010 |
| JP | 2013507792 A | 3/2013 |
| JP | 2014017481 A | 1/2014 |
| JP | 2015170750 A | 9/2015 |
| TW | 201140975 A | 11/2011 |
| WO | 0237625 A2 | 5/2002 |
| WO | 2005106546 A2 | 11/2005 |
| WO | 2006053444 A1 | 5/2006 |
| WO | 2011046898 A1 | 4/2011 |

OTHER PUBLICATIONS

Ward et al, "Realization of Phase Grating Comb Reflectors and Their Application of Widely Tunable DBR Lasers", IEEE Photonics Technology Letters, vol. 16, No. 11, Nov. 2004, pp. 2427-2429 (Year: 2004).*
Machine Translation and Abstract of Chinese Publication No. CN101022206, Aug. 22, 2007, 17 pages.
Machine Translation and Abstract of Chinese Publication No. CN101794952, Aug. 4, 2010, 8 pages.
Machine Translation and Abstract of Chinese Publication No. CN102074892, Feb. 22, 2012, 18 pages.
Machine Translation and Abstract of Chinese Publication No. CN102412504, Apr. 11, 2012, 19 pages.
Machine Translation and Abstract of Chinese Publication No. CN102646926, Aug. 22, 2012, 21 pages.
Machine Translation and Abstract of Chinese Publication No. CN103219649, Jul. 24, 2013, 14 pages.
Machine Translation and Abstract of Chinese Publication No. CN104104011, Oct. 15, 2014, 18 pages.
Ward, A. J., et al., "Realization of Phase Grating Comb Reflectors and Their Application to Widely Tunable DBR Lasers," IEEE Photonics Technology Letters, vol. 16, No. 11, Nov. 2004, pp. 2427-2429.

* cited by examiner

SUPER STRUCTURE GRATING AND TUNABLE LASER

CROSS-REFERENCE TO RELATED APPLICATIONS

This application is a continuation of International Patent Application No. PCT/CN2017/112142, filed on Nov. 21, 2017, which claims priority to Chinese Patent Application No. 201710247396.3, filed on Apr. 17, 2017, both of which are hereby incorporated by reference in their entireties.

TECHNICAL FIELD

This application relates to the field of fiber optic communications, and in particular, to a super structure grating and a tunable laser.

BACKGROUND

In the field of optical communications, a tunable laser (TL) is a laser that can adjust, within a specific range, a wavelength of an optical signal output by the tunable laser, and is mainly applied to a large-capacity wavelength division multiplexing transmission system. As an information amount explosively grows, a communications market expands continuously and quickly. To further increase bandwidth, a coherent modulation technology is used and becomes a mainstream solution for long-distance optical transmission at a rate of 100 gigabytes (G) and higher in the industry. However, the coherent modulation technology poses a stringent requirement on laser performance, for example, a lasing linewidth, and requirements on counters of the tunable laser, for example, a size, costs, reliability, and performance, are also higher because of various new demands. Featuring advantages such as a small volume and a high integration level, a monolithically integrated tunable laser becomes a mainstream technology in the current field of optical communications.

The monolithically integrated tunable laser may be produced on the whole after a gain region abuts a passive region on an indium phosphide (InP) substrate. The gain region is usually a multiple quantum well (MQW), and the passive region mainly includes a reflector and a phase section. Wavelength tuning is implemented by adjusting a refractive index of the reflector or a refractive index of the phase section. A reflection spectrum of the reflector is wavelength-selective. A commonly used reflector includes a distributed Bragg reflector (DBR) or a microring resonator. The reflection spectrum of the reflector is usually a comb reflection spectrum.

A super structure grating (SSG) has a comb reflection spectrum, a reflector region of the tunable laser may reflect light using the SSG, and distribution of refractive indices of the SSG is shown in the following formula (1):

$$n(z) = \begin{cases} n_0 + \delta_n \left( \sum_{k=1}^{N} \cos(2\pi \Delta F z (k - 0.5) + \phi_k) \right) \cos\left(\frac{2\pi z}{\Lambda_0}\right) \\ n_0 + \delta_n \left( 1 + 2 * \sum_{k=1}^{N} \cos(2\pi k \Delta F z + \phi_k) \right) \cos\left(\frac{2\pi z}{\Lambda_0}\right) \end{cases} \quad (1)$$

In the formula (1), when the SSG has an even quantity of reflection peaks, a value of $n(z)$ is $$n_0 + \delta_n \left( \sum_{k=1}^{N} \cos(2\pi \Delta F z (k - 0.5) + \phi_k) \right) \cos\left(\frac{2\pi z}{\Lambda_0}\right),$$

or when the SSG has an odd quantity of reflection peaks, a value of $n(z)$ is $$n_0 + \delta_n \left( 1 + 2 * \sum_{k=1}^{N} \cos(2\pi k \Delta F z + \phi_k) \right) \cos\left(\frac{2\pi z}{\Lambda_0}\right).$$

$\Delta F$, $\Lambda_k$, and $\Lambda_{k+1}$ meet the following formula (2):

$$\frac{1}{\Lambda_{k+1}} - \frac{1}{\Lambda_k} = \Delta F, \quad (2)$$

where
$n_0$ is an average effective refractive index of the SSG, $\Lambda_k$ determines a period of a cosine function, $\delta_n$ is a difference between a maximum value and a minimum value of an effective refractive index of the grating, N represents that a modulation function includes N cosine functions, z represents a location of the grating in a propagation direction, $\phi_k$ is a phase of a $k^{th}$ cosine function, and $\Delta F$ is determined based on the formula (2).

A modulation function of the super structure grating may be the following formula (3) based on the formula (1):

$$\text{profile}(z) = \begin{cases} \sum_{k=1}^{N} \cos(2\pi \Delta F z (k - 0.5) + \phi_k) \\ 2 * \sum_{k=1}^{N} \cos(2\pi k \Delta F z + \phi_k) \end{cases} \quad (3)$$

A reflection spectrum of a section of uniform grating has only one main peak, and the super structure grating may modulate a section of uniform grating using the modulation function, to generate a comb reflection spectrum. An effective refractive index of the uniform grating has only two values a high refractive index $n_h$ and a low refractive index $n_l$. As shown in FIG. 1, a dashed line represents a modulation function of an SSG, and the modulation function of the SSG is an analog continuous periodic function. After the modulation function is multiplied by the uniform grating, spatial distribution of refractive indices is also continuous, and the refractive index has another value in addition to the two values $n_h$ and $n_l$, and therefore the SSG is very difficult to produce. As shown in a formula (4), a threshold may be usually selected to perform two-level digital discretization processing on the continuous function shown in the formula (3) such that the SSG can be easily produced.

$$\text{Profile\_D}(z) = \begin{cases} 1, & \text{Profile}(z) > \text{Threshold} \\ -1, & \text{Profile}(z) \leq \text{Threshold} \end{cases} \quad (4)$$

A solid line in FIG. 1 shows an effect obtained by performing two-level digital discretization on the modulation function of the super structure grating using a threshold $V_1$. Modulation performed on a continuous grating using an envelope function obtained after discretization is also periodic. However, the refractive index still has only the two values $n_h$ and $n_l$, and a phase shift is introduced only when the envelope function switches between "1" and "−1". Therefore, the SSG is easy to produce through processing.

FIG. 2 is a schematic diagram of a relationship between a total SSG length and each of a reflectivity and a full width half maximum (FWHM) of a reflection peak of an SSG on which two-level discretization is performed. The total SSG length determines the reflectivity and the FWHM of the reflection peak. One total SSG length corresponds to one particular reflectivity and one particular FWHM. In other words, reflectivities of reflection peaks are in a one-to-one correspondence with FWHMs of the reflection peaks. Therefore, for the SSG on which two-level discretization is performed, a relatively desirable FWHM and a relatively desirable reflectivity cannot be obtained because the reflectivity and the FWHM cannot be separately optimized.

To sum up, for the SSG in other approaches, both the reflectivity and the FWHM of the reflection peak of the SSG are determined by the total SSG length, and the reflectivity and the FWHM of the SSG cannot be separately optimized. Therefore, both a relatively desirable FWHM and a relatively desirable reflectivity cannot be obtained.

SUMMARY

Embodiments of this application provide a super structure grating and a tunable laser, to separately optimize a reflectivity and an FWHM of a reflection peak of the super structure grating, thereby obtaining both a relatively desirable reflectivity and a relatively desirable FWHM.

To resolve the foregoing technical problem, the embodiments of this application provide the following technical solutions.

According to a first aspect, an embodiment of this application provides a super structure grating. The super structure grating spatially performs amplitude and phase modulation on a uniform grating using a modulation function, to generate a comb reflection spectrum, (N+1) modulation function discrete values are obtained after discretization processing is performed on the modulation function using N thresholds, and N is a positive integer greater than or equal to 2. Each of the (N+1) modulation function discrete values corresponds to one section of optical waveguide whose refractive index is uniform or corresponds to one section of uniform grating, and the uniform grating is an optical waveguide alternating between a high refractive index and a low refractive index. A reflectivity of a reflection peak of the super structure grating is adjusted based on a relationship of a ratio of a length of an optical waveguide corresponding to at least one of the (N+1) modulation function discrete values to a total grating length of the super structure grating, and based on the total grating length of the super structure grating. A full width half maximum FWHM of the reflection peak of the super structure grating is adjusted based on the ratio relationship and the total grating length of the super structure grating.

In this embodiment of this application, the modulation function is discretized to obtain the (N+1) modulation function discrete values. The reflectivity of the reflection peak of the super structure grating is adjusted based on the relationship of the ratio of the length of the optical waveguide corresponding to the at least one of the (N+1) modulation function discrete values to the total grating length of the super structure grating, and based on the total grating length of the super structure grating. The FWHM of the reflection peak of the super structure grating is adjusted based on the ratio relationship and the total grating length of the super structure grating. In other words, both the reflectivity and the FWHM of the reflection peak of the super structure grating may be adjusted using two dimensions. The reflectivity of the reflection peak determines a threshold and output power of a tunable laser, the FWHM of the reflection peak determines a mode selection feature of the laser, and a smaller FWHM indicates a larger side mode suppression ratio. The super structure grating provided in this embodiment of this application may separately optimize the reflectivity and the FWHM such that both a relatively desirable reflectivity and a relatively desirable FWHM can be obtained.

With reference to the first aspect, in a first possible implementation of the first aspect, when a value of N is 2, three modulation function discrete values are obtained after discretization processing is performed on the modulation function, one of the three modulation function discrete values corresponds to one section of optical waveguide whose refractive index is uniform, and each of the other two of the three modulation function discrete values corresponds to one section of uniform grating. The three modulation function discrete values separately corresponding to the optical waveguide whose refractive index is uniform and the uniform grating may be obtained by performing three-level discretization processing on the super structure grating, and the reflectivity and the FWHM of the reflection peak of the super structure grating are adjusted based on the relationship of the ratio of the length of the optical waveguide whose refractive index is uniform and that corresponds to one of the three modulation function discrete values to the total grating length of the super structure grating, and based on the total grating length of the super structure grating such that both the reflectivity and the FWHM are optimized.

With reference to the first aspect or the first possible implementation of the first aspect, in a second possible implementation of the first aspect, two of the (N+1) modulation function discrete values correspond to a same type of uniform grating. The reflectivity of the super structure grating may be optimized by controlling a ratio of a length of an optical waveguide corresponding to each modulation function discrete value in the modulation function to the total grating length.

With reference to the first aspect or the first possible implementation of the first aspect, in a third possible implementation of the first aspect, when signs of adjacent modulation function discrete values are different or one of the adjacent modulation function discrete values is 0, a phase shift is added between optical waveguides respectively corresponding to the adjacent modulation function discrete values. When a sign of the modulation function changes, a phase shift is added between optical waveguides such that the reflection spectrum of the super structure grating is flatter, and reflection performance of the super structure grating is improved.

According to a second aspect, an embodiment of this application further provides a tunable laser. The tunable laser includes a reflection region, where the reflection region is configured to tune an optical signal using the super structure grating in any one of the first aspect and the possible implementations of the first aspect. This embodiment of this application further provides a tunable laser that is based on the super structure grating described above. In the tunable laser provided in this embodiment of this application, a modulation function is discretized to obtain (N+1) modulation function discrete values. A reflectivity of a reflection peak of the super structure grating is adjusted based on a relationship of a ratio of a length of an optical waveguide corresponding to at least one of the (N+1) modulation function discrete values to a total grating length of the super structure grating, and based on the total grating length of the super structure grating. An FWHM of the reflection peak of the super structure grating is adjusted based on the ratio relationship and the total grating length of the super structure grating. In other words, both the reflectivity and the FWHM of the reflection peak of the super structure grating may be adjusted using two dimensions. The reflectivity of the reflection peak determines a threshold and output power of the tunable laser, the FWHM of the reflection peak determines a mode selection feature of the laser, and a smaller FWHM indicates a larger side mode suppression ratio. The tunable laser provided in this embodiment of this application may separately optimize the reflectivity and the FWHM such that both a relatively desirable reflectivity and a relatively desirable FWHM can be obtained.

With reference to the second aspect, in a first possible implementation of the second aspect, the tunable laser further includes a gain region and a phase region, the reflection region includes a first reflector and a second reflector, the gain region is cascaded to both the first reflector and the phase region using an optical waveguide, the phase region is cascaded to the gain region and the second reflector, the gain region is configured to generate an optical signal, and the phase region is configured to perform a phase adjustment on the optical signal such that the tunable laser can perform fine tuning on a lasing wavelength of the optical signal. The generation of the optical signal and the phase adjustment to the optical signal may be separately implemented using the gain region and the phase region in the tunable laser, and the optical signal is transmitted using the reflection region after fine tuning is performed on the lasing wavelength of the optical signal.

With reference to the first possible implementation of the second aspect, in a second possible implementation of the second aspect, the tunable laser further includes a semiconductor optical amplifier (SOA) and a photodetector (PD), the first reflector is cascaded to the SOA using an optical waveguide, and the second reflector is cascaded to the PD using an optical waveguide, the SOA is configured to perform power amplification on the optical signal, and the PD is configured to perform power monitoring or power attenuation on the optical signal. Power amplification and power monitoring or power attenuation of the optical signal may be implemented using the SOA and the PD in the tunable laser.

With reference to the first possible implementation of the second aspect, in a third possible implementation of the second aspect, the tunable laser further includes a first SOA and a second SOA, the first reflector is cascaded to the first SOA using an optical waveguide, and the second reflector is cascaded to the second SOA using an optical waveguide, the first SOA is configured to perform power amplification on an optical signal reflected by the first reflector, and the second SOA is configured to perform power amplification on an optical signal reflected by the second reflector. Each of the first reflector and the second reflector in the tunable laser may be connected to one SOA, and power amplification is performed on an optical signal reflected by each reflector such that an optical signal having higher power can be transmitted.

With reference to the second aspect, in a fourth possible implementation of the second aspect, the tunable laser further includes a multimode interference (MMI) coupler, a gain region, and a phase region, the reflection region includes a first reflector and a second reflector, there is a port on one side of the MMI coupler, the port is connected to the phase region, there are two ports on the other side of the MMI coupler, and the two ports are respectively connected to the first reflector and the second reflector, two sides of the phase region are respectively cascaded to the gain region and one port of the MMI coupler, the gain region is configured to generate an optical signal, and the phase region is configured to perform a phase adjustment on the optical signal such that the tunable laser can perform fine tuning on a lasing wavelength of the optical signal. The MMI coupler is configured to couple, to the phase region, light reflected by the first reflector and the second reflector. A band gap of an active gain region is relatively small, and corresponds to a target output wavelength of the tunable laser. The active gain region is usually a multiple quantum well, and converts electric energy into optical energy when electricity is injected, to provide a gain.

With reference to the fourth possible implementation of the second aspect, in a fifth possible implementation of the second aspect, the tunable laser further includes a phase adjustment module, the phase adjustment module is connected to both the MMI coupler and the first reflector, or the phase adjustment module is connected to both the MMI coupler and the second reflector, and the phase adjustment module is configured to match a phase of a reflection spectrum of the first reflector and a phase of a reflection spectrum of the second reflector. The phase adjustment module is added to a Y branch arm of the first reflector or a Y branch arm of the second reflector, and is configured to match phases of reflection spectra of the two reflectors. In this way, combination can be better performed for the first reflector or the second reflector using the MMI coupler.

With reference to the fourth possible implementation of the second aspect, in a sixth possible implementation of the second aspect, the tunable laser further includes an SOA and a PD, the first reflector has a first port, the second reflector has a second port, and the gain region has a third port, the first port is connected to the SOA or the PD, the second port is connected to the SOA or the PD, and/or the third port is connected to the SOA or the PD, the SOA is configured to perform power amplification on the optical signal, and the PD is configured to perform power monitoring or power attenuation on the optical signal. At least one port in the first reflector, the second reflector, and the gain region may be connected to the SOA using an optical waveguide. The first reflector, the second reflector, and the gain region may be connected to the PD using an optical waveguide. The tunable laser may separately implement power amplification and power monitoring or power attenuation of the optical signal using the integrated SOA and the integrated PD.

With reference to the second aspect, the first possible implementation, the second possible implementation, the third possible implementation, the fourth possible implementation, the fifth possible implementation, or the sixth possible implementation of the second aspect, in a seventh possible implementation of the second aspect, the reflection region includes a heating unit, a transport layer, a reflector, an upper barrier layer, a sacrificial layer, a lower barrier layer, and a substrate layer, the heating unit is located above the transport layer, the transport layer is located above the sacrificial layer, and sequentially includes an upper cladding, a waveguide layer, and a lower cladding from top to bottom, the reflector is located in the transport layer, and the reflector is configured to tune an optical signal using the super structure grating in any one of the first aspect and the possible implementations of the first aspect, the upper barrier layer is located between the transport layer and the sacrificial layer, the sacrificial layer is located between the upper barrier layer and the lower barrier layer, a protection structure is formed in the sacrificial layer, the protection structure and an inter-layer region form a hollow structure, and the inter-layer region includes a region between the transport layer and the substrate layer, the lower barrier layer is located between the sacrificial layer and the substrate layer, and the substrate layer is located below the sacrificial layer. The reflection region in the tunable laser may perform thermal tuning using the hollow structure, to improve thermal tuning efficiency of the super structure grating.

With reference to the seventh possible implementation of the second aspect, in an eighth possible implementation of the second aspect, the hollow structure is totally hollow, voids exist between a transport layer part corresponding to the reflector and transport layer materials on two sides, and a suspended structure is formed between the voids and above the hollow structure, and the voids are periodically arranged in a waveguide direction, after extending through the upper cladding, the waveguide layer, the lower cladding, and the upper barrier layer, the voids reach a region in which the hollow structure is located, there is a support structure between the adjacent voids, the support structure is used to provide lateral mechanical support for the suspended structure, and a length period of the support structure in the waveguide direction is not equal to a period of a modulation function of the super structure grating. To avoid sacrificing performance of a reflection spectrum of the grating during thermal tuning, a region between corrosion windows is a support region of the suspended structure, and the region between the corrosion windows is not aligned with a peak or not aligned with a valley of the modulation function of the super structure grating. Two corrosion windows at a leftmost end and at a rightmost end are used to prevent temperature from being excessively low on the two sides.

With reference to the seventh possible implementation of the second aspect, in a ninth possible implementation of the second aspect, a transport layer part corresponding to the reflector is totally isolated from transport layer materials on two sides to generate voids, and after extending through the upper cladding, the waveguide layer, the lower cladding, and the upper barrier layer, the voids reach a region in which the hollow structure is located, and a bottom of the sacrificial layer is not totally corroded, a bottom support structure is retained in the sacrificial layer, and the bottom support structure is used to provide support for the suspended structure. The reflection region in the tunable laser may perform thermal tuning using the suspended structure, to improve thermal tuning efficiency of the super structure grating.

With reference to the ninth possible implementation of the second aspect, in a tenth possible implementation of the second aspect, a length period of the bottom support structure in a waveguide direction is not equal to a period of a modulation function of the super structure grating.

With reference to the seventh possible implementation of the second aspect, in an eleventh possible implementation of the second aspect, the super structure grating is located in a lower part of the upper cladding in a transport layer part corresponding to the reflector, or the super structure grating is located in an upper part of the lower cladding in a transport layer part corresponding to the reflector, or the super structure grating is located in a waveguide layer part corresponding to the reflector, or the super structure grating is partially located in each of the upper cladding and the waveguide layer in a transport layer part corresponding to the reflector, or the super structure grating is partially located in each of the lower cladding and the waveguide layer in a transport layer part corresponding to the reflector. The reflector is located in the upper cladding, and is configured to tune a wavelength of the optical signal. Optionally, the reflector may be located in the lower cladding, or the waveguide layer, or the upper cladding and the waveguide layer, or the lower cladding and the waveguide layer. There is a plurality of specific implementations. This is for description only. The optical signal is propagated in the upper cladding, the lower cladding, and the waveguide layer, and the optical signal can be reflected only when the super structure grating is located at these locations.

With reference to the seventh possible implementation of the second aspect, in a twelfth possible implementation of the second aspect, a refractive index of the waveguide layer is greater than a refractive index of the upper cladding and a refractive index of the lower cladding. Therefore, total reflection occurs when the optical signal is propagated in the waveguide layer. In this way, as much photon energy as possible can be confined in the waveguide layer such that the waveguide layer can provide a low-loss propagation channel for the optical signal, to reduce losses of optical signal propagation.

With reference to the seventh possible implementation to the twelfth possible implementation of the second aspect, in a thirteenth possible implementation of the second aspect, the reflection region further includes an indium phosphide InP buffer layer, the lower barrier layer is located between the sacrificial layer and the InP buffer layer, and the InP buffer layer is located between the lower barrier layer and the substrate layer. A main function of the InP buffer layer is to provide an InP material with better crystal quality, to provide a better material basis for another layer of materials.

DESCRIPTION OF EMBODIMENTS

Figure 1:
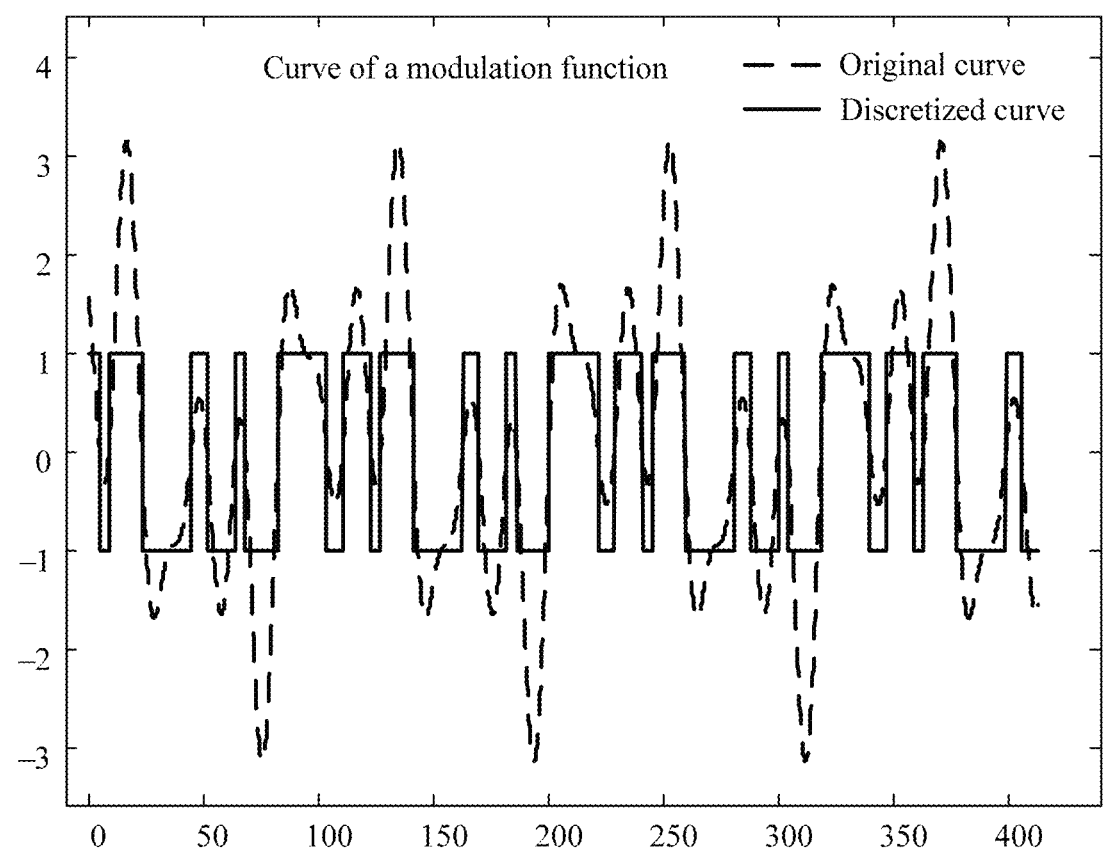
FIG. 1 is a diagram of an effect obtained after two-level discretization is performed on a modulation function of a super structure grating in other approaches.

Embodiments of this application provide a super structure grating and a tunable laser, to separately optimize a reflectivity and an FWHM of a reflection peak of the super structure grating, thereby obtaining both a relatively desirable reflectivity and a relatively desirable FWHM.

The following describes the embodiments of this application with reference to the accompanying drawings.

In the specification, claims, and the accompanying drawings of this application, the terms "first", "second", and the like are intended to distinguish between similar objects but do not necessarily indicate a specific order. It should be understood that the terms used in such a way are interchangeable in proper circumstances, which is merely a discrimination manner that is used when objects having a same attribute are described in the embodiments of this application. Moreover, the terms "include", "contain", and any other variants mean to cover the non-exclusive inclusion, for example, a process, method, system, product, or device that includes a list of units is not necessarily limited to those units, but may include other units not expressly listed or inherent to such a process, method, product, or device.

Three conditions for generating laser light include implementing a population inversion, meeting a threshold condition, and meeting a resonance condition. A primary condition for generating laser light is the population inversion. In other words, an electron in a valence band is pumped to a conduction band in a semiconductor. To implement the population inversion, a p-n junction is usually formed using heavily doped p-type and n-type materials. In this case, under an action of an external voltage, a population inversion occurs near the junction, an electron is stored at a high Fermi level, and an electron hole is stored at a low Fermi level. Certainly, there are many other methods for generating a population inversion. Implementing a population inversion is a necessary condition for generating laser light, but is not a sufficient condition. To generate laser light, a resonant cavity having an extremely low loss is also required. Main parts of a conventional resonant cavity are two reflectors that are parallel to each other. Stimulated radiation light is reflected between the two reflectors back and forth, continually causing new stimulated radiation such that the stimulated radiation light is continually amplified. Enhanced interference can be generated at an output end to output stable laser light only when a gain obtained by amplifying the stimulated radiation is greater than various losses in a laser, in other words, only when a specific threshold condition is met. The resonance condition is after a length L and a refractive index N of the resonant cavity are determined, only for light at a particular frequency, light oscillation occurs and stable laser light is output. This indicates that the resonant cavity plays a frequency-selective role in the output laser light.

Figure 7:
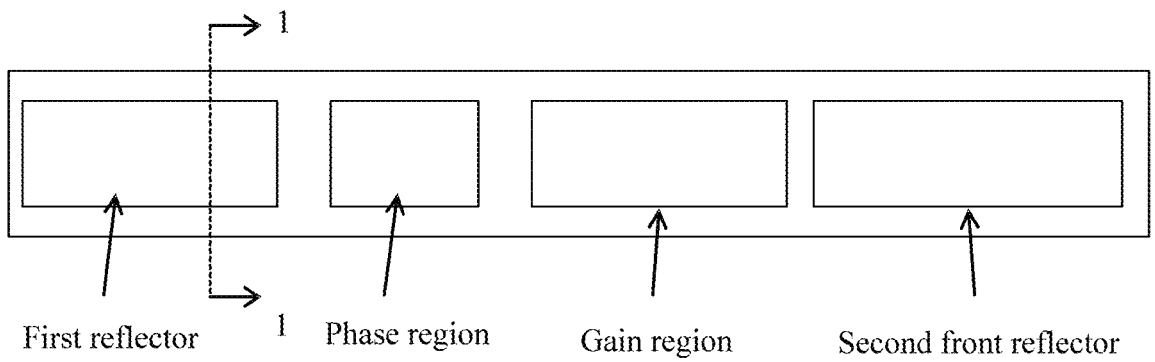
FIG. 7 is a schematic structural diagram of composition of a tunable laser according to an embodiment of this application.

A tunable laser of a monolithically integrated semiconductor is usually produced after a gain region on an InP substrate abuts a passive region. FIG. 7 is a schematic plan view of the tunable laser, and the tunable laser includes a reflection region, a gain region, and a phase adjustment region. The reflection region may include a first reflector and a second reflector. A band gap of the gain region is relatively small. When electricity is injected, the gain region converts electric energy into optical energy, to provide a gain. The passive region structurally mainly includes a reflector. A band gap of the passive region is greater than photon energy of a laser wavelength, and the passive region absorbs less laser light. Therefore, a very low absorption loss can be provided. To cover an entire band C (approximately in a range of 40 nm), a tuning range is usually expanded using a "Vernier effect" of the two reflectors. Because the two reflectors are usually located in front of and behind the gain region, the two reflectors are usually respectively referred to as a front reflector and a rear reflector. The two reflectors may be considered to be equivalent, and names may be interchanged. In addition, the passive region may further include the phase adjustment region. The phase adjustment region is configured to perform fine tuning on an effective optical path in the resonant cavity in order to change an output wavelength of the laser.

Figure 2:
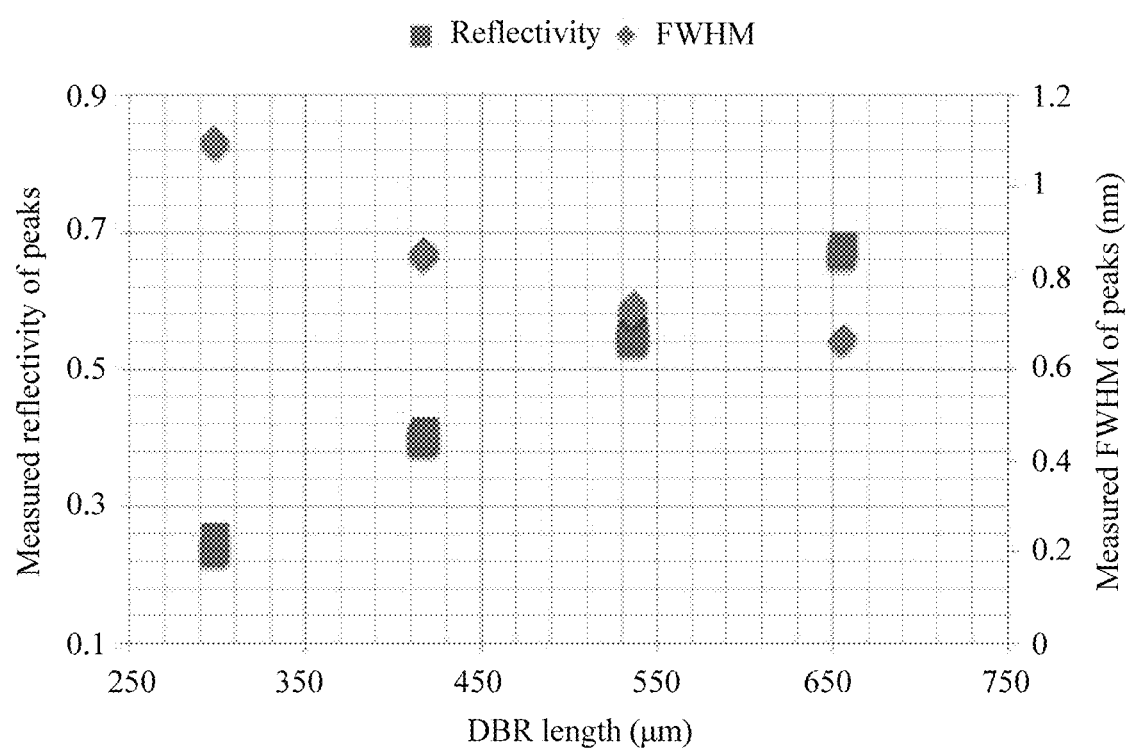
FIG. 2 is a schematic diagram of a relationship between a total SSG length and each of a reflectivity and an FWHM of a reflection peak of a super structure grating on which two-level discretization processing is performed in other approaches.

Each of the two reflectors of the tunable laser has a comb reflection spectrum, and the comb reflection spectrum has a plurality of reflection peaks. The reflection peaks may be adjusted. The output wavelength of the laser may be adjusted by adjusting the reflection peaks. In other approaches, a reflectivity and an FWHM of a reflection peak are related only to a total grating length of a super structure grating. As shown in FIG. 2, the total grating length of the super structure grating in other approaches determines the reflectivity and the FWHM of the reflection peak. A total grating length of one super structure grating corresponds to one particular reflectivity and one particular FWHM. In other words, reflectivities of reflection peaks are in a one-to-one correspondence with FWHMs of the reflection peaks. Therefore, a relatively desirable FWHM and a relatively desirable reflectivity cannot be obtained because the reflectivity and the FWHM cannot be separately optimized. In the embodiments of the present disclosure, high-level discretization is performed on a modulation function such that the reflectivity and the FWHM of the reflection peak can be adjusted using two dimensions, and the reflectivity and the FWHM can be separately optimized. Therefore, both a relatively desirable reflectivity and a relatively desirable FWHM can be obtained.

An embodiment of this application first provides a super structure grating. The super structure grating spatially performs amplitude and phase modulation on a uniform grating using a modulation function, to generate a comb reflection spectrum, (N+1) modulation function discrete values are obtained after discretization processing is performed on the modulation function using N thresholds, and N is a positive integer greater than or equal to 2.

Each of the (N+1) modulation function discrete values corresponds to one section of optical waveguide whose refractive index is uniform or corresponds to one section of uniform grating, and the uniform grating is an optical waveguide alternating between a high refractive index and a low refractive index.

A reflectivity of a reflection peak of the super structure grating is adjusted based on a relationship of a ratio of a length of an optical waveguide corresponding to at least one of the (N+1) modulation function discrete values to a total grating length of the super structure grating, and based on the total grating length of the super structure grating.

An FWHM of the reflection peak of the super structure grating is adjusted based on the ratio relationship and the total grating length of the super structure grating.

The (N+1) modulation function discrete values are obtained after discretization processing is performed on the modulation function of the super structure grating using the N thresholds. In other words, the (N+1) modulation function discrete values may be obtained after N-level discretization processing is performed on the modulation function of the super structure grating. For example, in this embodiment of this application, two thresholds may be selected to perform three-level discretization processing on the modulation function of the super structure grating, to obtain three modulation function discrete values. This is totally different from that, in other approaches, two modulation function discrete values are obtained after only one threshold is selected to perform two-level discretization on the modulation function. Next, an example in which a value of N is 2 is used to describe the super structure grating provided in this embodiment of this application.

The super structure grating provided in this embodiment of this application may separately optimize the reflectivity and the FWHM of the reflection peak. After three-level discretization is performed, the three modulation function discrete values may be obtained. The following formula is an expression of a modulation function discrete value Profile_D(z)

$$\text{Profile\_D}(z) = \begin{cases} 1, & \text{Profile}(z) > \text{Threshold1} \\ 0, & \text{Threshold2} < \text{Profile}(z) \le \text{Threshold1} \\ -1, & \text{Profile}(z) \le \text{Threshold2} \end{cases}$$

Figure 3:
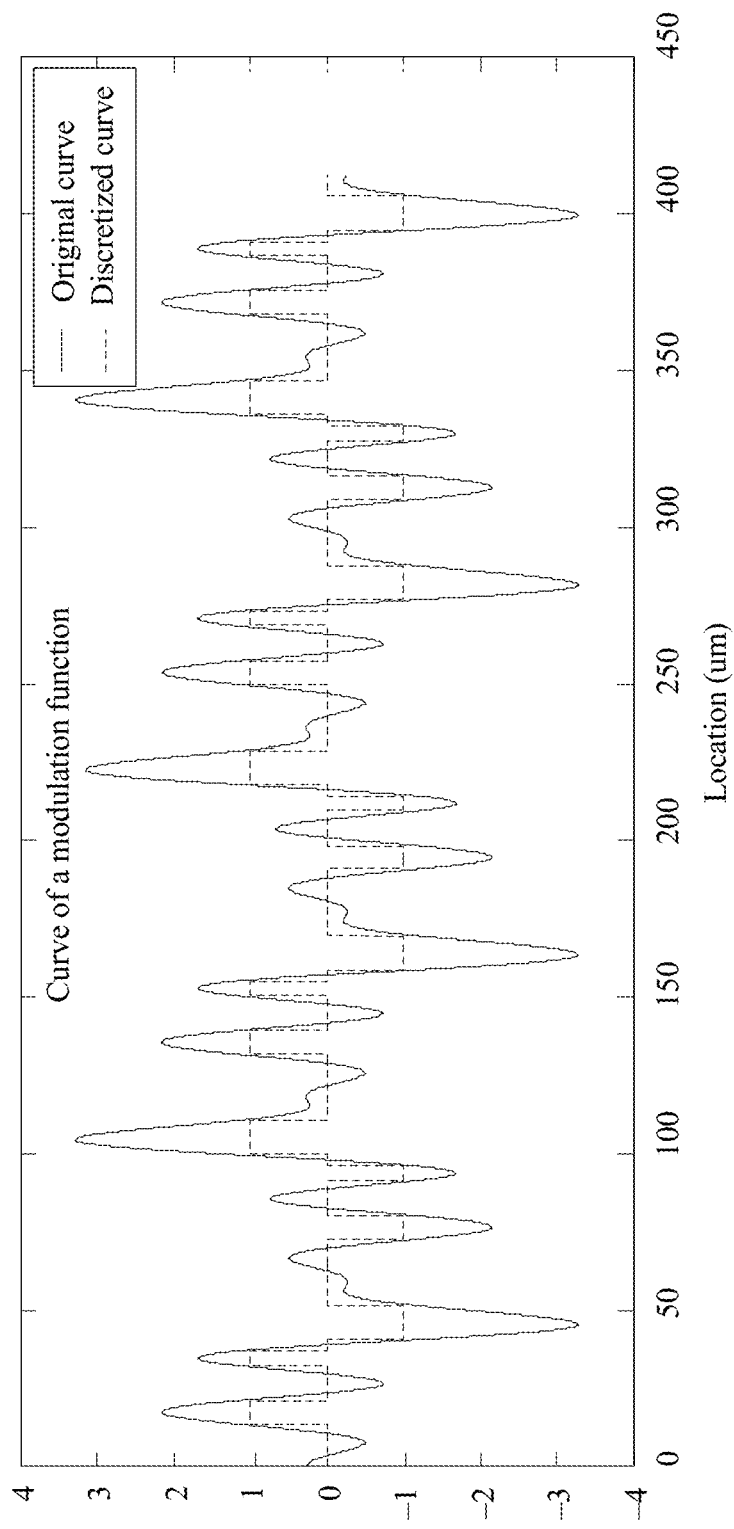
FIG. 3 is a diagram of an effect obtained after three-level discretization processing is performed on a modulation function of a super structure grating according to an embodiment of this application.
Figure 4:
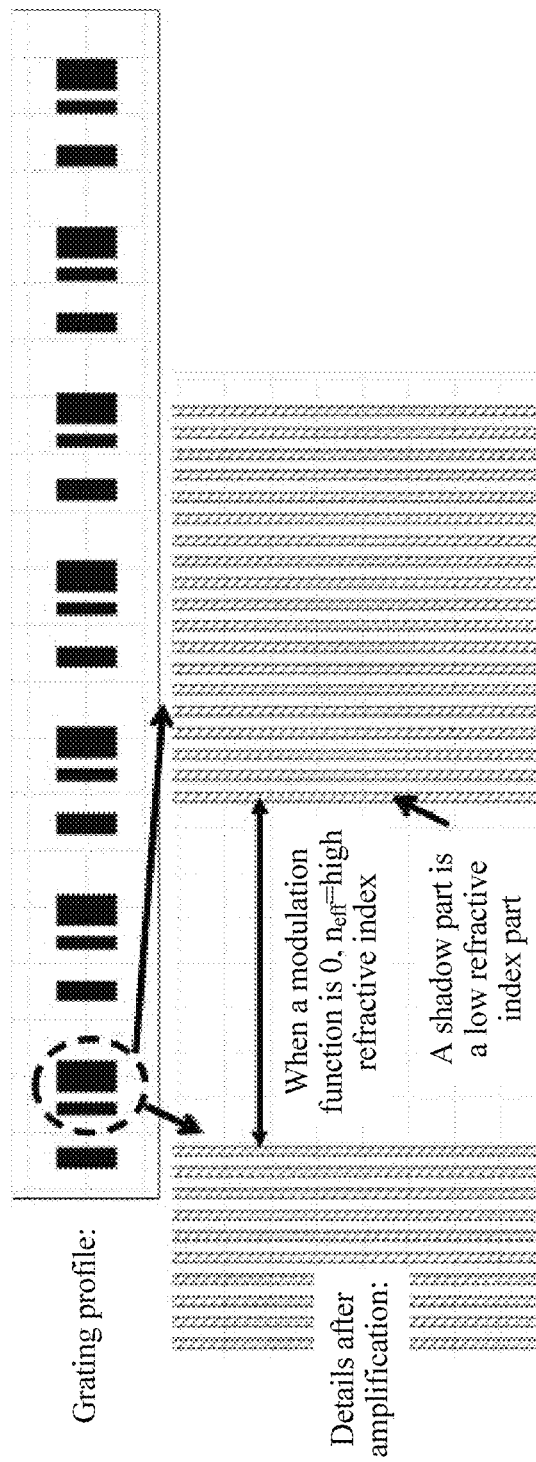
FIG. 4 is a structural diagram of a super structure grating on which three-level discretization processing is performed according to an embodiment of this application.

Threshold1 and Threshold2 are two thresholds. In this embodiment of this application, three modulation function discrete values may be obtained by performing three-level discretization processing on the modulation function Profile (z) using the two thresholds. FIG. 3 is a diagram of an effect obtained after three-level discretization processing is performed on a modulation function of a super structure grating according to an embodiment of this application. A discretized modulation function has three values 1, 0, and −1. In this case, after the modulation function acts on the uniform grating, super structure grating parts corresponding to 1 and −1 still have only two values a high refractive index $n_h$ and a low refractive index $n_l$. A super structure grating part corresponding to 0 has only the high refractive index $n_h$. For the uniform grating, the high refractive index $n_h$ and the low refractive index $n_l$ alternately appear, and reflection occurs in an interface between the high refractive index $n_h$ and the low refractive index $n_l$. FIG. 4 is a structural diagram of a super structure grating on which three-level discretization processing is performed according to an embodiment of this application. When the modulation function is 1 or −1, for the super structure grating, the high refractive index $n_h$ and the low refractive index $n_l$ alternately appear. This case is the same as that of the uniform grating. When the modulation function is 0, the super structure grating has only the high refractive index $n_h$. In this case, effective reflective surfaces are reduced. Therefore, the reflectivity of the reflection peak of the super structure grating may be optimized by controlling the ratio of the modulation function 0. As shown in FIG. 4, after a profile of the super structure grating is amplified, it can be seen that a shadow part is a low refractive index part, and when the modulation function is equal to 0, the super structure grating has only the high refractive index $n_h$.

Figure 5:
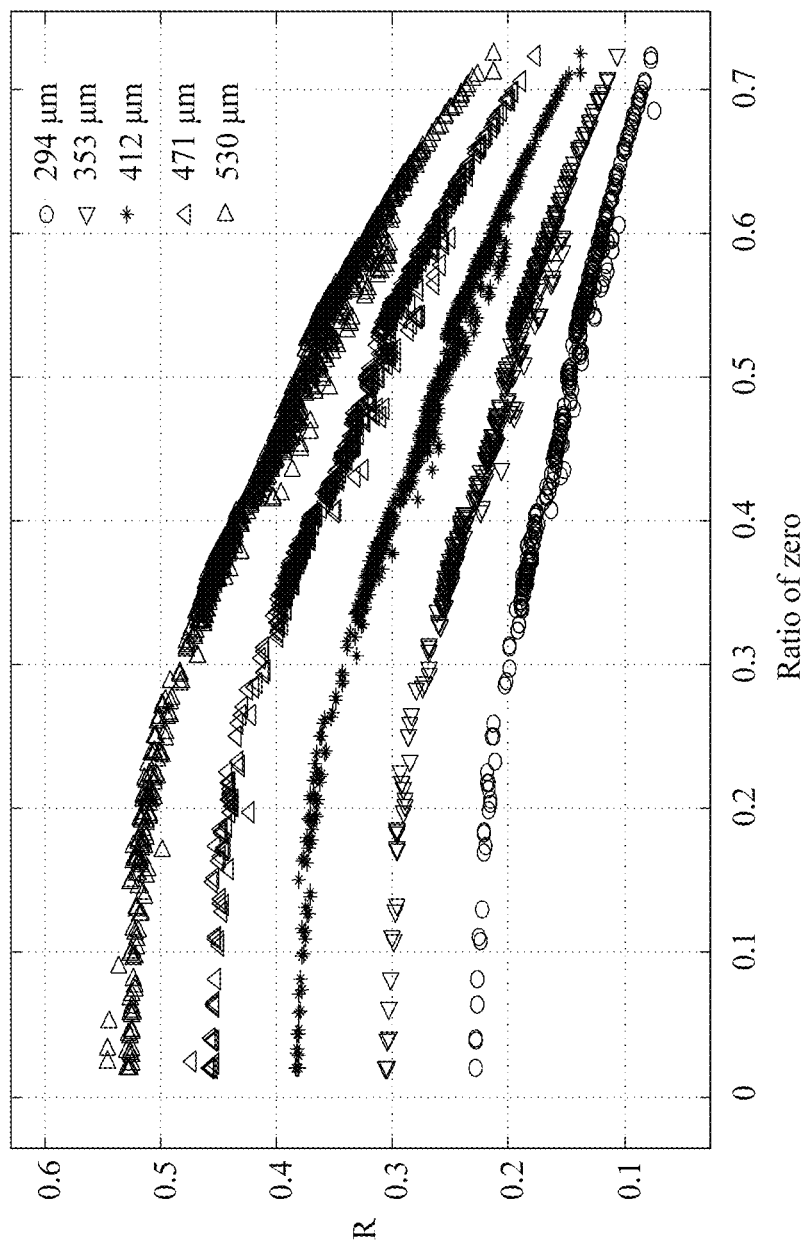
FIG. 5 is a schematic diagram of a relationship among a reflectivity of a super structure grating on which three-level discretization processing is performed, a total grating length, and a ratio of 0 in a modulation function in the total grating length according to an embodiment of this application.
Figure 6:
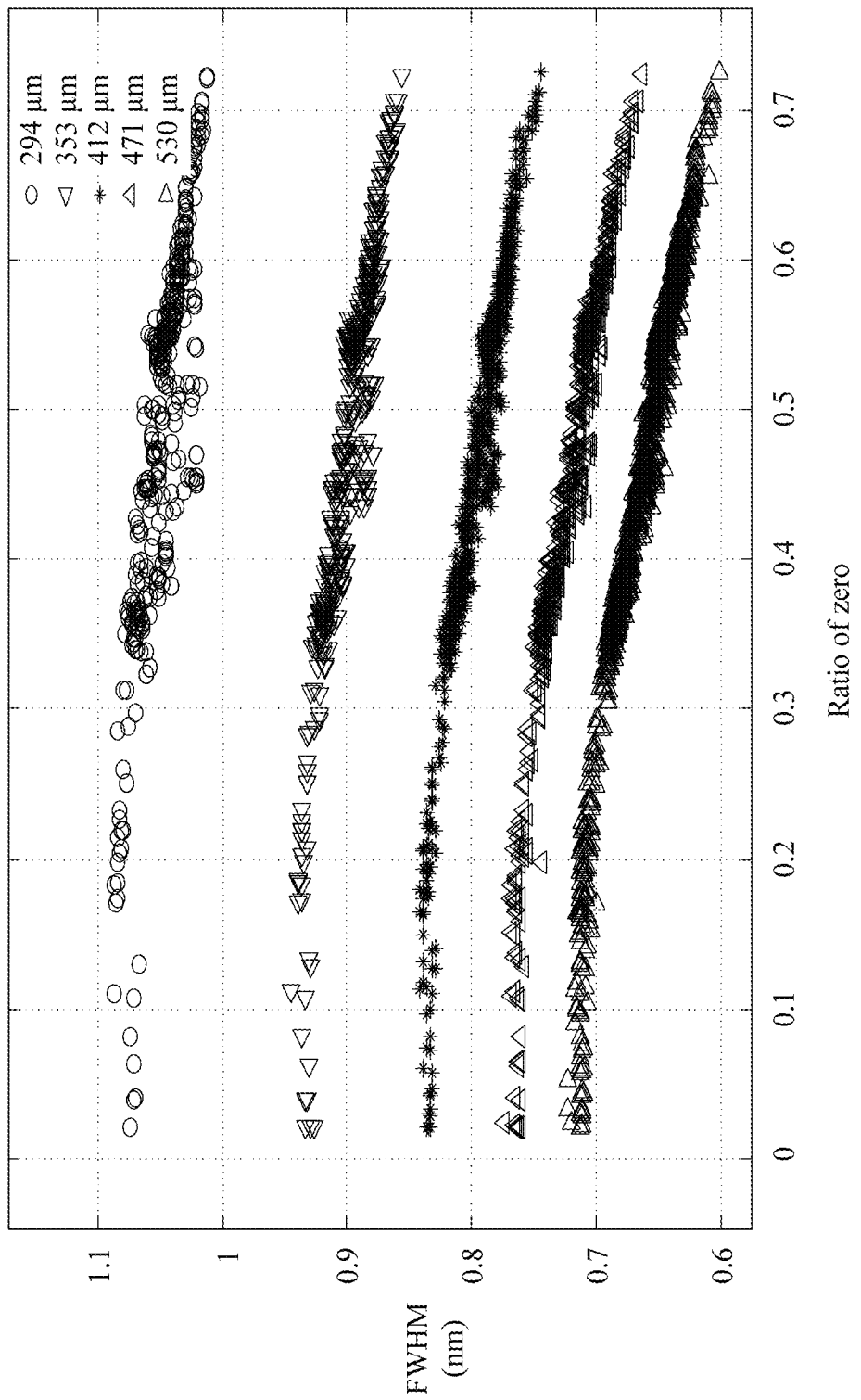
FIG. 6 is a schematic diagram of a relationship among an FWHM of a super structure grating on which three-level discretization processing is performed, a total grating length, and a ratio of 0 in a modulation function in the total grating length according to an embodiment of this application.

For a super structure grating on which three-level discretization is performed, a ratio of 0 in a discretized modulation function in a total grating length of the super structure grating may be adjusted, and then a reflectivity and an FWHM of the grating may be adjusted based on both the ratio and the total grating length of the super structure grating. FIG. 5 is a schematic diagram of a relationship among a reflectivity of a super structure grating on which three-level discretization processing is performed, a total grating length, and a ratio of 0 in a modulation function in the total grating length according to an embodiment of this application, and FIG. 6 is a schematic diagram of a relationship among an FWHM of a super structure grating on which three-level discretization processing is performed, a total grating length, and a ratio of 0 in a modulation function in the total grating length according to an embodiment of this application. There are five lines in each of FIG. 5 and FIG. 6, and the lines correspond to super structure gratings having different total grating lengths. "Ratio, of an optical waveguide corresponding to a modulation function 0, in the total grating length" is referred to as "ratio of 0 in a modulation function". When the modulation function is 0, the super structure grating has only $n_h$. In this case, effective reflective surfaces are reduced. The reflectivity of the super structure grating may be optimized by controlling the ratio of the length of the optical waveguide corresponding to the modulation function 0 to the total grating length. A longer total grating length indicates a larger reflectivity. For the FWHM, a longer total grating length indicates a smaller FWHM, and a larger ratio of the modulation function discrete value 0 indicates a smaller FWHM. In this case, each of the reflectivity and the FWHM of the super structure grating is related to the total grating length and the ratio of the modulation function discrete value 0. In this case, the reflectivity and the FWHM of the reflection peak of the super structure grating may be separately optimized using two dependent variables (the total grating length and the ratio of the modulation function discrete value 0). As shown in FIG. 5 and FIG. 6, both the reflectivity and the FWHM of the super structure grating are related to both the total grating length and the ratio of 0 in the modulation function. In other words, the reflectivity is related to the total grating length and the ratio of 0 in the modulation function, and the FWHM is related to the total grating length and the ratio of 0 in the modulation function. Because a relationship of a ratio of a length of an optical waveguide corresponding to a modulation function discrete value to the total grating length is introduced as a degree of design freedom, the reflectivity and the FWHM of the super structure grating may be separately optimized. For example, when the total grating length is 294 micrometers (μm), and the ratio of "0" in the modulation function in the total grating length is 0.3, a super structure grating on which a reflectivity R of a reflection peak is equal to 0.2 and an FWHM is equal to 1.08 nm may be obtained. When the total grating length of the super structure grating is 412 μm, and the ratio of "0" in the modulation function in the total grating length is 0.6, a super structure grating on which R is equal to 0.2 and an FWHM is equal to 0.77 nm may be obtained.

In an embodiment of this application, when a value of N is 2, three modulation function discrete values are obtained after discretization processing is performed on the modulation function, one of the three modulation function discrete values corresponds to one section of optical waveguide whose refractive index is uniform, and each of the other two of the three modulation function discrete values corresponds to one section of uniform grating. The three modulation function discrete values that separately correspond to the optical waveguide whose refractive index is uniform and the uniform grating may be obtained by performing three-level discretization processing on the super structure grating. The reflectivity and the FWHM of the reflection peak of the super structure grating may be adjusted based on a relationship of a ratio of a length of the optical waveguide whose refractive index is uniform and that corresponds to one of the three modulation function discrete values to the total grating length of the super structure grating, and based on the total grating length of the super structure grating such that both the reflectivity and the FWHM are optimized. For example, the three modulation function discrete values include a first value, a second value, and a third value. The first value corresponds to a section of uniform grating, the second value corresponds to a section of optical waveguide whose refractive index is uniform, and the third value corresponds to a section of uniform grating. The first value and the third value may be respectively the modulation function discrete values 1 and −1 shown in FIG. 3, and the second value may be the modulation function discrete value 0 shown in FIG. 3.

In an embodiment of this application, two of the (N+1) modulation function discrete values correspond to a same type of uniform grating, and the reflectivity of the super structure grating may be optimized by controlling a ratio of an optical waveguide corresponding to each modulation function discrete value in the modulation function to the total grating length. For example, as shown in FIG. 3, an optical waveguide part corresponding to the modulation function discrete value 0 has only a high refractive index or a low refractive index such that a reflective interface in the super structure grating is not formed when a value of the modulation function is the modulation function discrete value 0.

In an embodiment of this application, when signs of adjacent modulation function discrete values are different or one of the adjacent modulation function discrete values is 0, a phase shift is added between optical waveguides respectively corresponding to the adjacent modulation function discrete values. When a sign of the modulation function changes, a phase shift is added between optical waveguides such that a reflection spectrum of the super structure grating is flatter, and reflection performance of the super structure grating is improved.

It should be noted that, in the foregoing embodiment and accompanying drawings of this application, an example in which three-level discretization processing is performed on the modulation function of the super structure grating when the value of N is 2 is used for description. Optionally, four-level discretization processing or higher-level discretization processing may be performed on the modulation function of the super structure grating provided in this embodiment of this application. Four-level or higher-level discretization processing may be performed on the modulation function of the super structure grating using more thresholds. For example, in an example of the description of performing three-level discretization processing on the super structure grating, the modulation functions 1, −1, and 0 actually correspond to different forms of modulating the uniform grating by the super structure grating. Four-level discretization is used as an example, and the modulation function discrete value may be 1, 0.5, −0.5, or −1. A specific value of each modulation function discrete value may be configured based on an application scenario, provided that a correspondence between each modulation function discrete value and a modulation form corresponding to each optical waveguide whose refractive index is uniform or each uniform grating is configured. For example, "1" or "−1" corresponds to a first type of uniform grating, and 0.5 or −0.5 corresponds to a second type of uniform grating. When a sign of the modulation function discrete value changes, a phase shift is introduced. For five-level discretization or higher-level discretization, the modulation function discrete value may be 1, 0.5, 0, −0.5, −1, or the like. For example, "1" or "−1" still corresponds to the first type of uniform grating, 0.5 or −0.5 corresponds to the second type of uniform grating, and 0 corresponds to the optical waveguide whose refractive index is uniform. When signs of adjacent modulation function discrete values are different or one of the adjacent modulation function discrete values is 0, a phase shift is introduced.

It can be learned based on the example of the description in the foregoing embodiment of this application that the super structure grating spatially performs amplitude and phase modulation on the uniform grating using the modulation function, to generate the comb reflection spectrum, the (N+1) modulation function discrete values are obtained after discretization processing is performed on the modulation function using the N thresholds, and N is a positive integer greater than or equal to 2. Each of the (N+1) modulation function discrete values corresponds to one section of optical waveguide whose refractive index is uniform or corresponds to one section of uniform grating, and the uniform grating is an optical waveguide alternating between a high refractive index and a low refractive index. The modulation function is discretized to obtain the (N+1) modulation function discrete values. The reflectivity of the reflection peak of the super structure grating is adjusted based on the relationship of the ratio of the length of the optical waveguide corresponding to the at least one of the (N+1) modulation function discrete values to the total grating length of the super structure grating, and based on the total grating length of the super structure grating. The FWHM of the reflection peak of the super structure grating is adjusted based on the ratio relationship and the total grating length of the super structure grating. In other words, both the reflectivity and the FWHM of the reflection peak of the super structure grating may be adjusted using two dimensions. The reflectivity of the reflection peak determines a threshold and output power of a tunable laser, the FWHM of the reflection peak determines a mode selection feature of the laser, and a smaller FWHM indicates a larger side mode suppression ratio. The super structure grating provided in this embodiment of this application may separately optimize the reflectivity and the FWHM such that both a relatively desirable reflectivity and a relatively desirable FWHM can be obtained.

The super structure grating provided in this application is described in the foregoing embodiment. A tunable laser provided in this application is described next. The tunable laser includes a reflection region. The reflection region is configured to tune an optical signal using the super structure grating in the foregoing embodiment. In other words, an embodiment of this application further provides a tunable laser that is based on the super structure grating described above. In the tunable laser provided in this embodiment of this application, a modulation function is discretized to obtain (N+1) modulation function discrete values. A reflectivity of a reflection peak of the super structure grating is adjusted based on a relationship of a ratio of a length of an optical waveguide corresponding to at least one of the (N+1) modulation function discrete values to a total grating length of the super structure grating, and based on the total grating length of the super structure grating. An FWHM of the reflection peak of the super structure grating is adjusted based on the ratio relationship and the total grating length of the super structure grating. In other words, both the reflectivity and the FWHM of the reflection peak of the super structure grating may be adjusted using two dimensions. The reflectivity of the reflection peak determines a threshold and output power of the tunable laser, the FWHM of the reflection peak determines a mode selection feature of the laser, and a smaller FWHM indicates a larger side mode suppression ratio. The tunable laser provided in this embodiment of this application may separately optimize the reflectivity and the FWHM such that both a relatively desirable reflectivity and a relatively desirable FWHM can be obtained.

In an embodiment of this application, referring to FIG. 7, in addition to the reflection region, the tunable laser further includes a gain region and a phase region.

The reflection region includes a first reflector and a second reflector, the gain region is cascaded to both the first reflector and the phase region using an optical waveguide, the phase region is cascaded to the gain region and the second reflector, the gain region is configured to generate an optical signal, and the phase region is configured to perform a phase adjustment on the optical signal such that the tunable laser can perform fine tuning on a lasing wavelength of the optical signal.

The super structure grating provided in the foregoing embodiment of this application may be disposed in the first reflector or the second reflector. As shown in FIG. 7, a location of the first reflector and a location of the second reflector may be interchanged. For example, the first reflector is a rear reflector, and the second reflector is a front reflector. The generation of the optical signal and the phase adjustment to the optical signal may be separately implemented using the gain region and the phase region in the tunable laser, and the optical signal is transmitted using the reflection region after fine tuning is performed on the lasing wavelength of the optical signal.

FIG. 7 is a principle diagram of a monolithically integrated tunable laser. The monolithically integrated tunable laser includes four sections a gain region, a first reflector, a second reflector, and a phase region. The gain region is located in an active region. A band gap of the gain region is relatively small. The gain region is usually a multiple quantum well, and converts electric energy into optical energy when electricity is injected, to provide a gain. The first reflector and the second reflector are equivalent, and may be interchanged. A reflection spectrum of the first reflector and a reflection spectrum of the second reflector are wavelength-selective, and the first reflector and the second reflector are used to perform wavelength tuning. The first reflector and the second reflector include the super structure grating described above. A reflection spectrum of a reflector is a comb reflection spectrum. There is a difference between a free spectral range of a comb reflection spectrum of the first reflector and a free spectral range of a comb reflection spectrum of the second reflector. Then the two reflectors expand a tuning range using a Vernier effect. The phase region provides a phase adjustment such that the laser can perform fine tuning on the lasing wavelength. Light is generated in the gain region, and is reflected by the first reflector and the second reflector to produce resonance and generate laser light. Then the laser light is transmitted through the first reflector and the second reflector, and is emitted. The first reflector, the second reflector, and the phase region are all located in a passive region. A band gap of the passive region is greater than photon energy of a laser wavelength, and the passive region absorbs few photons. The passive region may etch an MQW in the active region using an etching and regrowth technology, and then produce a compound having a larger band gap through a secondary epitaxy. Both the first reflector and the second reflector may use the super structure grating described in the foregoing embodiment. The reflection spectrum of the first reflector and the reflection spectrum of the second reflector are wavelength-selective, and the first reflector and the second reflector are used to perform wavelength tuning. The phase region, the first reflector, and the second reflector may all change a refractive index of a waveguide through electric injection, by changing thermal injection, or using another equivalent method, to perform wavelength tuning.

Figure 8:
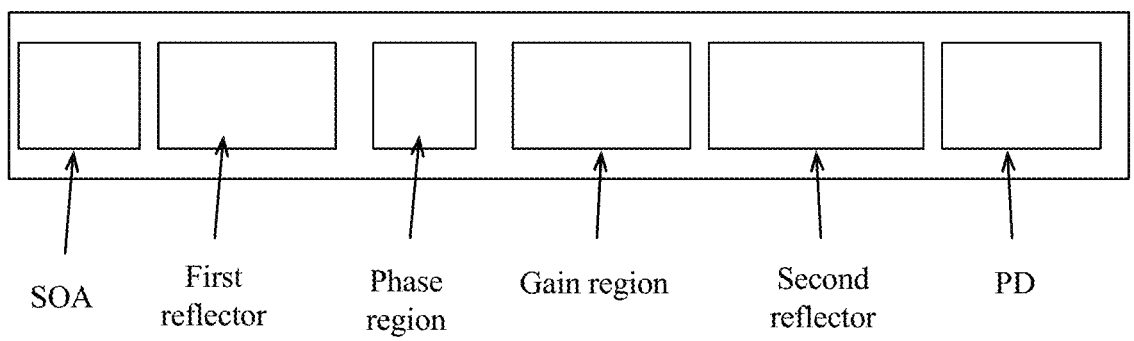
FIG. 8 is a schematic structural diagram of composition of a tunable laser according to another embodiment of this application.

In another embodiment of this application, referring to FIG. 8, the tunable laser further includes a SOA and a PD, the first reflector is cascaded to the SOA using an optical waveguide, and the second reflector is cascaded to the PD using an optical waveguide, the SOA is configured to perform power amplification on the optical signal, and the PD is configured to perform power monitoring or power attenuation on the optical signal.

As shown in FIG. 8, a location of the first reflector and a location of the second reflector may be interchanged. Power amplification and power monitoring or power attenuation of the optical signal may be implemented using the SOA and the PD in the tunable laser. It should be noted that the SOA may be separately integrated at a left end or at a right end of the tunable laser, to perform power amplification, or the PD may be separately integrated at a left end or at a right end of the tunable laser, to perform power monitoring or power attenuation.

In another embodiment of this application, the tunable laser further includes a first SOA and a second SOA, the first reflector is cascaded to the first SOA using an optical waveguide, and the second reflector is cascaded to the second SOA using an optical waveguide, the first SOA is configured to perform power amplification on an optical signal reflected by the first reflector, and the second SOA is configured to perform power amplification on an optical signal reflected by the second reflector.

Each of the first reflector and the second reflector in the tunable laser may be connected to one SOA, and power amplification is performed on an optical signal reflected by each reflector such that an optical signal having higher power can be transmitted.

Figure 9:
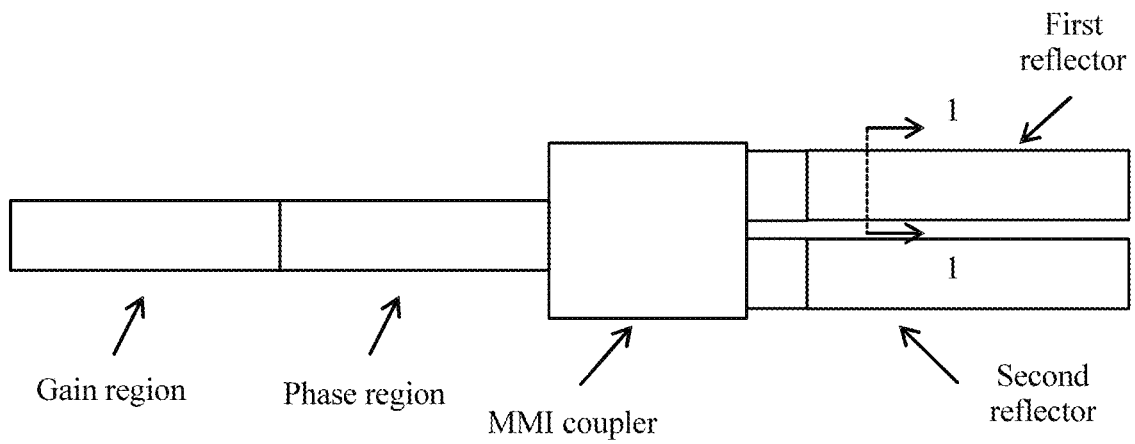
FIG. 9 is a schematic structural diagram of composition of a tunable laser according to another embodiment of this application.

In an embodiment of this application, referring to FIG. 9, the tunable laser further includes a MMI coupler, a gain region, and a phase region, the reflection region includes a first reflector and a second reflector, there is a port on one side of the MMI coupler, the port is connected to the phase region, there are two ports on the other side of the MMI coupler, and the two ports are respectively connected to the first reflector and the second reflector, two sides of the phase region are respectively cascaded to the gain region and one port of the MMI coupler, the gain region is configured to generate an optical signal, and the phase region is configured to perform a phase adjustment on the optical signal such that the tunable laser can perform fine tuning on a lasing wavelength of the optical signal.

A tunable laser provided in an embodiment of this application includes a gain region, a phase region, an MMI coupler, a first reflector, and a second reflector. The MMI coupler is a 1×2 coupler, there is one port on one side, the port is connected to the phase region, there are two ports on the other side, and the two ports are respectively connected to the first reflector and the second reflector. The phase region is cascaded to the gain region and the MMI coupler. The MMI coupler is configured to couple, to the phase region, light reflected by the first reflector and the second reflector. A band gap of an active gain region is relatively small, and corresponds to a target output wavelength of the tunable laser. The active gain region is usually a multiple quantum well, and converts electric energy into optical energy when electricity is injected, to provide a gain. The first reflector and the second reflector may be considered to be equivalent, and names may be interchanged. A reflection spectrum of the first reflector and a reflection spectrum of the second reflector are wavelength-selective, and the first reflector and the second reflector are used to perform wavelength tuning. For example, the first reflector and the second reflector include the super structure grating described above. A reflection spectrum of a reflector is a comb reflection spectrum. There is a difference between a free spectral range of a comb reflection spectrum of the first reflector and a free spectral range of a comb reflection spectrum of the second reflector. Laser light reflected by the first reflector and the second reflector to a resonant cavity of the laser are combined using the MMI coupler, and then a tuning range is expanded using an additive Vernier effect. The phase region provides a phase adjustment such that the laser can perform fine tuning on a lasing wavelength. The first reflector, the second reflector, and the phase region are all located in a passive region. The phase region, the first reflector, and the second reflector may all change a refractive index of a waveguide through electric injection, by changing thermal injection, or using another equivalent method, to perform wavelength tuning.

Figure 10:
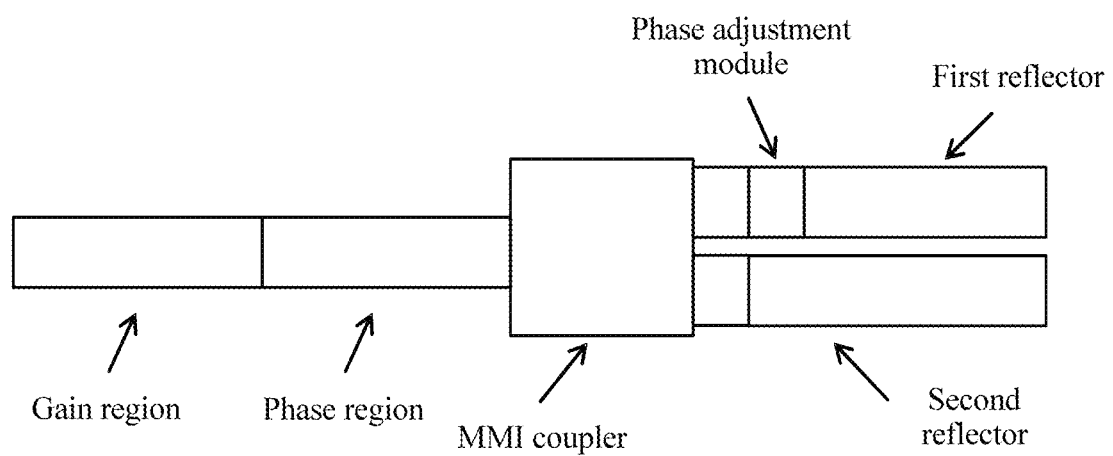
FIG. 10 is a schematic structural diagram of composition of a tunable laser according to another embodiment of this application.

In an embodiment of this application, referring to FIG. 10, relative to the tunable laser shown in FIG. 9, the tunable laser further includes a phase adjustment module, the phase adjustment module is connected to both the MMI coupler and the first reflector, or the phase adjustment module is connected to both the MMI coupler and the second reflector, and the phase adjustment module is configured to match a phase of a reflection spectrum of the first reflector and a phase of a reflection spectrum of the second reflector.

The phase adjustment module is added to a Y branch arm of the first reflector or a Y branch arm of the second reflector, and is configured to match phases of reflection spectra of the two reflectors. In this way, combination can be better performed for the first reflector or the second reflector using the MMI coupler. An example in which the phase adjustment module is disposed on the first reflector is used in FIG. 10 for description.

In an embodiment of this application, the tunable laser further includes an SOA and a PD, the first reflector has a first port, the second reflector has a second port, and the gain region has a third port, and the first port is connected to the SOA or the PD, the second port is connected to the SOA or the PD, and/or the third port is connected to the SOA or the PD.

At least one port in the first reflector, the second reflector, and the gain region may be connected to the SOA using an optical waveguide. The first reflector, the second reflector, and the gain region may be connected to the PD using an optical waveguide. The tunable laser may separately implement power amplification and power monitoring or power attenuation of the optical signal using the integrated SOA and the integrated PD. For example, if there is a port 1 at a left end of the gain region, there is a port 2 at a right end of the first reflector, and there is a port 3 at a right end of the second reflector, the SOA may be integrated at any one of the three ports to amplify output optical power, or the PD may be integrated at any one of the three ports to perform power monitoring or power attenuation.

Figure 11:
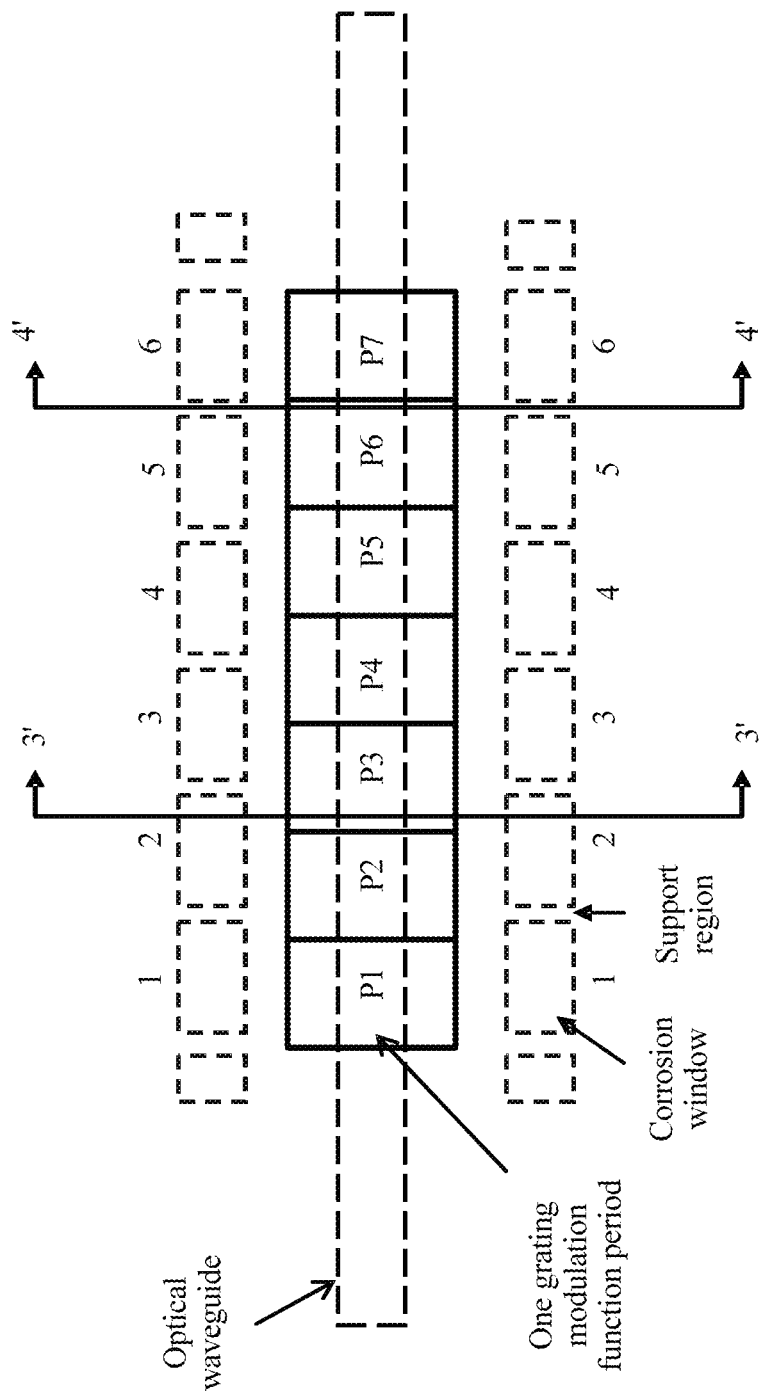
FIG. 11 is a top view of a reflector, which has a suspended structure, of a tunable laser according to an embodiment of this application.

In an embodiment of this application, FIG. 11 is a top view of a reflector, which has a suspended structure, of a tunable laser according to an embodiment of this application. A region principle of the reflector, which has the suspended structure, of the tunable laser is described in FIG. 11, each of P1 to P7 is one grating modulation function period, there are corrosion windows 1 to 6 on each of a part above an optical waveguide and a part below the optical waveguide, and there is a support region between two adjacent corrosion windows. There is one auxiliary window on each of a left side of a window 1 and a right side of a window 6, to prevent temperature of the reflection region from being excessively low at a leftmost end of P1 or at a rightmost end of P7.

Figure 12:
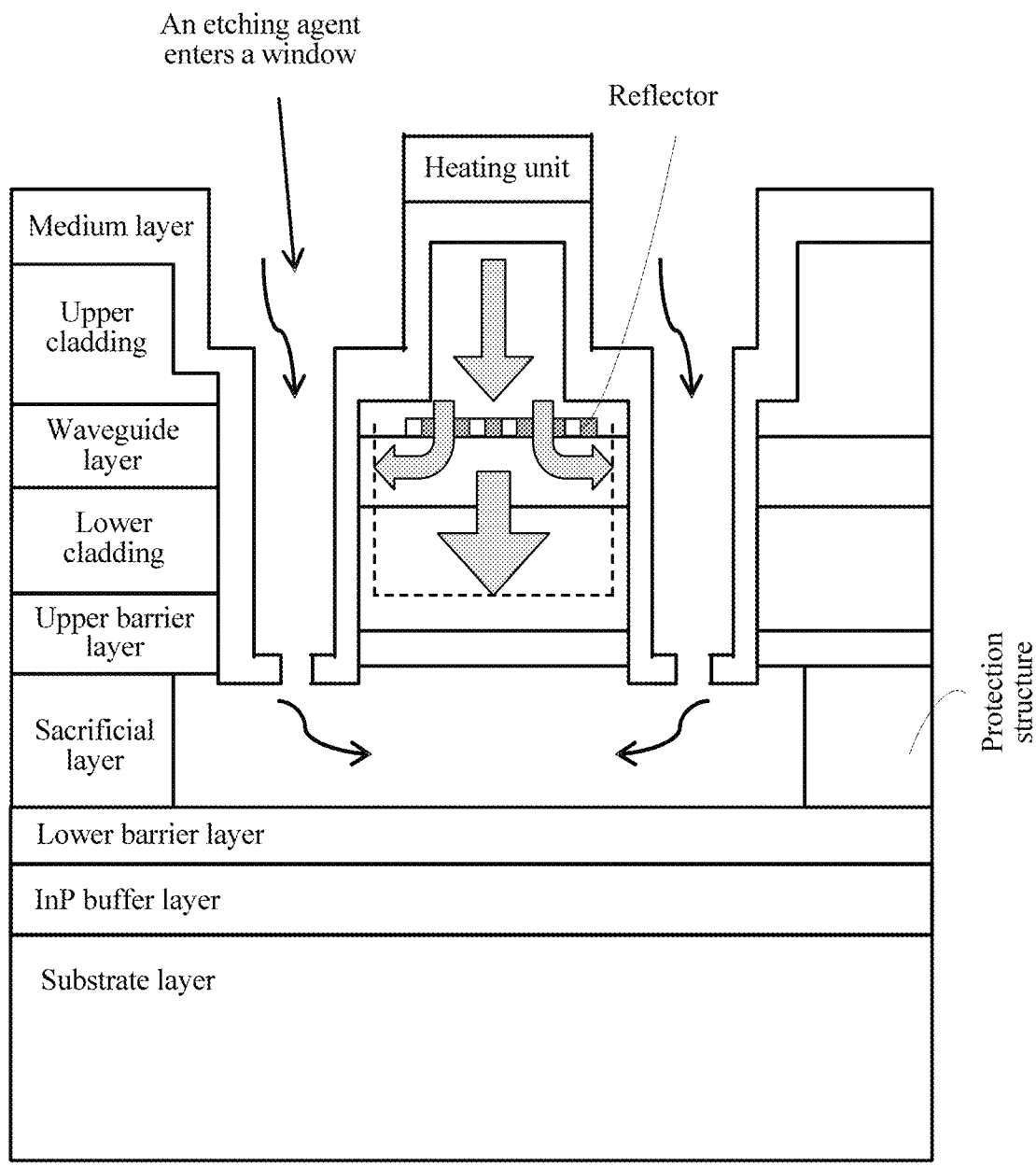
FIG. 12 is a sectional view of a tunable laser along a location 3'-3' in FIG. 11 according to an embodiment of this application.
Figure 13:
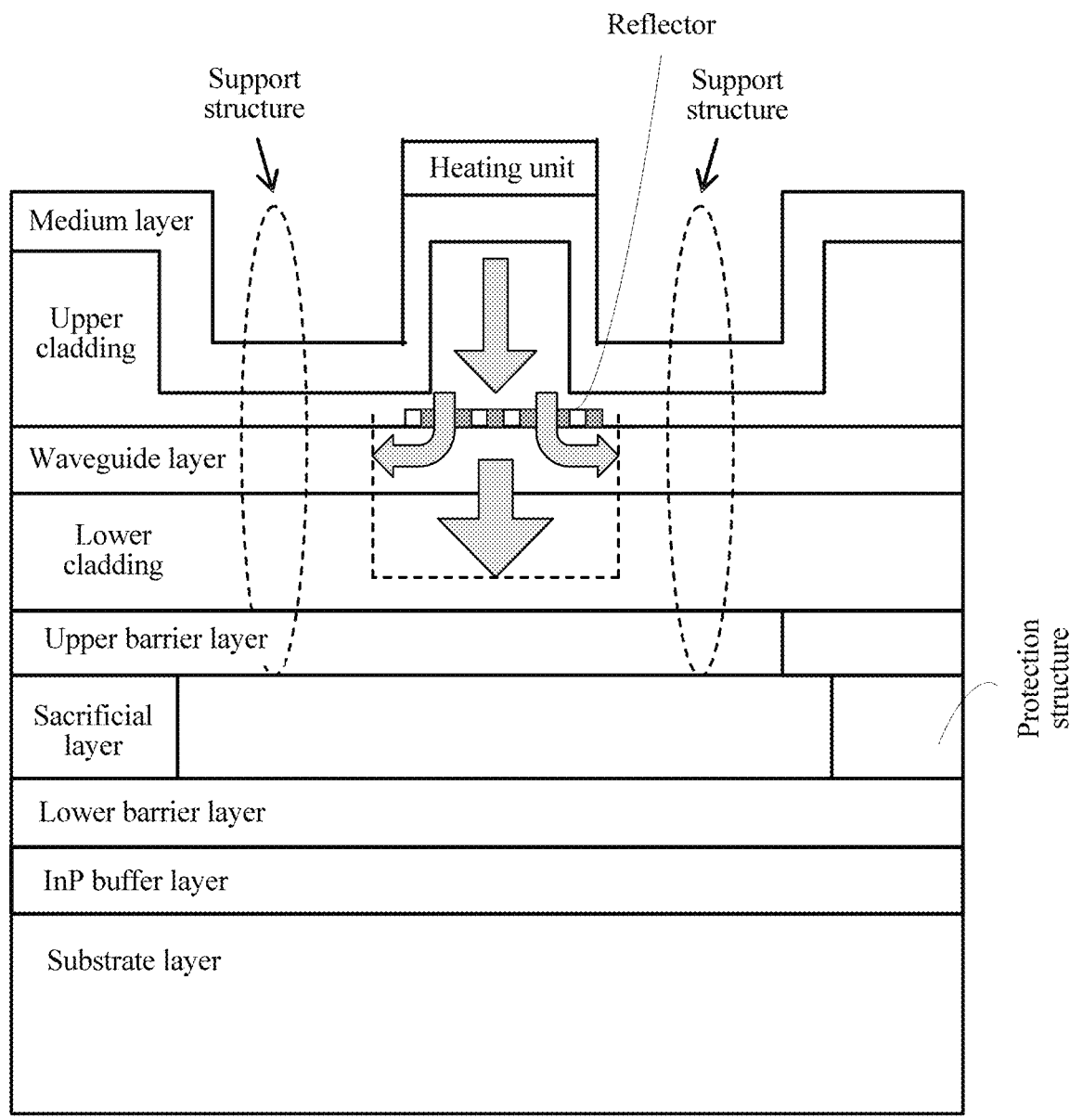
FIG. 13 is a sectional view of a tunable laser along a location 4'-4' in FIG. 11 according to an embodiment of this application.

FIG. 12 is a sectional view of a tunable laser along a location 3'-3' in FIG. 11 according to an embodiment of this application. FIG. 13 is a sectional view of a tunable laser along a location 4'-4' in FIG. 11 according to an embodiment of this application. The reflection region in the tunable laser includes a heating unit, a transport layer, a reflector, an upper barrier layer, a sacrificial layer, a lower barrier layer, and a substrate layer, the heating unit is located above the transport layer, the transport layer is located above the sacrificial layer, and sequentially includes an upper cladding, a waveguide layer, and a lower cladding from top to bottom, the reflector is located in the transport layer, and the reflector is configured to tune an optical signal using the super structure grating described above, the upper barrier layer is located between the transport layer and the sacrificial layer, the sacrificial layer is located between the upper barrier layer and the lower barrier layer, a protection structure is formed in the sacrificial layer, the protection structure and an inter-layer region form a hollow structure, and the inter-layer region includes a region between the transport layer and the substrate layer, the lower barrier layer is located between the sacrificial layer and the substrate layer, and the substrate layer is located below the lower barrier layer.

In some embodiments of this application, the reflection region further includes an InP buffer layer. The lower barrier layer is located between the sacrificial layer and the InP buffer layer. The InP buffer layer is located between the lower barrier layer and the substrate layer.

The reflection region in the tunable laser may perform thermal tuning using the suspended structure, to improve thermal tuning efficiency of the super structure grating. FIG. 11 is a principle diagram of the reflection region having the suspended structure, and FIG. 12 and FIG. 13 are schematic diagrams of a section 3'-3' and a section 4'-4' in FIG. 11. As shown in FIG. 12 and FIG. 13, in terms of a material structure, the reflection region sequentially includes the substrate layer, the lower barrier layer, the sacrificial layer, the upper barrier layer, the lower cladding, the waveguide layer, the upper cladding, a medium layer, and a heating layer from top to bottom. A super structure grating on which high-level discretization is performed is distributed in an interface between the waveguide layer and the upper cladding, and a part alternating between black and white in FIG. 12 is a reflector including a super structure grating. The substrate layer is a layer at which a crystal semiconductor needs to grow based on a crystal substrate, and the substrate layer is located below the lower barrier layer. If the InP buffer layer is further disposed in the reflection region, the InP buffer layer is located between the lower cladding and the substrate layer, and is configured to provide an InP material with better crystal quality, to provide a better material basis for another layer of materials. The upper cladding, the waveguide layer, and the lower cladding are located between the medium layer and the InP buffer layer, and are configured to provide a low-loss transmission channel for the optical signal. The medium layer is configured to prevent a current of a heater from leaking to the upper cladding. The heater may generate heat using the current. The heating layer is configured to change temperature of a reflector region. The heating unit is configured to provide the heat to the reflector. A heating resistor may be used. Temperature of the heating resistor may be changed when the current flows through the heating resistor. Several downward arrows for the heater indicate heat flux directions. The waveguide layer uses an indium gallium arsenide phosphide (InGaAsP) material. There are protection structures on left and right sides of the sacrificial layer in FIG. 12, and the protection structures are located on two sides of an upper surface of the lower barrier layer in a direction in which the optical signal is propagated in the waveguide layer.

In an embodiment of this application, a hollow structure is totally hollow, voids exist between a transport layer part corresponding to the reflector and transport layer materials on two sides, and a suspended structure is formed between the voids and above the hollow structure, and the voids are periodically arranged in a waveguide direction, after extending through the upper cladding, the waveguide layer, the lower cladding, and the upper barrier layer, the voids reach a region in which the hollow structure is located, there is a support structure between the adjacent voids, the support structure is used to provide lateral mechanical support for the suspended structure, and a length period of the support structure in the waveguide direction is not equal to a period of a modulation function of the super structure grating. There are some periodic dashed-line boxes on two sides of an optical waveguide shown in FIG. 11. The optical waveguide includes the waveguide layer, an upper cladding, and a lower cladding. Regions in the dashed-line boxes are windows used to etch a sacrificial layer material in a production process. An etching agent is used to separately etch a sacrificial layer material below the reflector using windows on two sides of the reflector, until a hollow structure region is exposed. The suspended structure shown in FIG. 12 and FIG. 13 is formed above the hollow structure and between the regions between the windows on the two sides of the optical waveguide. A region between the left and right protection structures in the sacrificial layer in FIG. 12 is the hollow structure, and after extending through the upper cladding, the waveguide layer, the lower cladding, and the upper barrier layer, voids reach a region in which the hollow structure is located. In addition, to avoid sacrificing performance of a reflection spectrum of the grating during thermal tuning, a region between corrosion windows is a support region of the suspended structure. The length period, in the waveguide direction, of the support structure providing lateral mechanical support is not equal to the period of the modulation function of the super structure grating, to prevent the reflection spectrum of the super structure grating from being less flat during thermal tuning, and avoid deterioration of performance of the tunable laser.

That the length period of the support structure in the waveguide direction is not equal to the period of the modulation function of the super structure grating may include the following case, the lateral support structure and any particular wave peak or any particular wave valley in the spatial period of the modulation function of the super structure grating are staggered such that reflection flatness of the super structure grating can be improved. The wave peak in the spatial period of the modulation function is a maximum value in the spatial period of the modulation function, and the wave valley in the spatial period of the modulation function is a minimum value in the spatial period of the modulation function.

It should be noted that there is one auxiliary window on each of a left side of a window 1 and a right side of a window 6 in FIG. 11, to prevent temperature of the reflection region from being excessively low at a leftmost end of P1 or at a rightmost end of P7.

It should be noted that, in this embodiment of this application, no InP buffer layer may be disposed in the reflection region. In this case, the lower barrier layer is directly located above the substrate layer.

It should be noted that the openings shown in FIG. 11 are intended to help a person skilled in the art to better understand the embodiments of the present disclosure, instead of limiting the scope of the embodiments of the present disclosure. A person skilled in the art may evidently make various equivalent modifications or changes to shapes of the openings based on the provided example in FIG. 11. Such modifications or changes also fall within the scope of the embodiments of the present disclosure.

Figure 14:
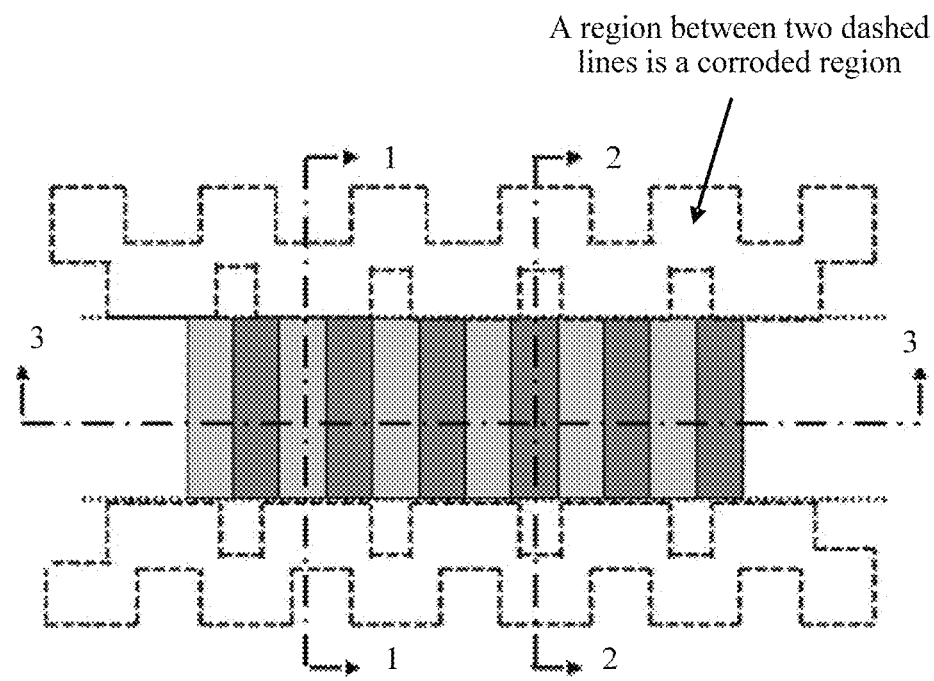
FIG. 14 is a top view of a bottom support structure included in a tunable laser according to an embodiment of this application.
Figure 15:
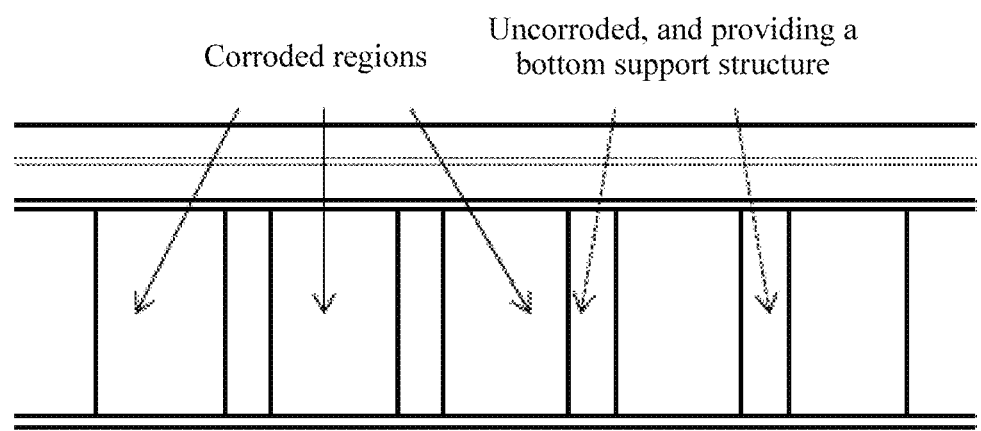
FIG. 15 is a sectional view of a tunable laser along a location 3-3 in FIG. 14 according to an embodiment of this application.
Figure 16:
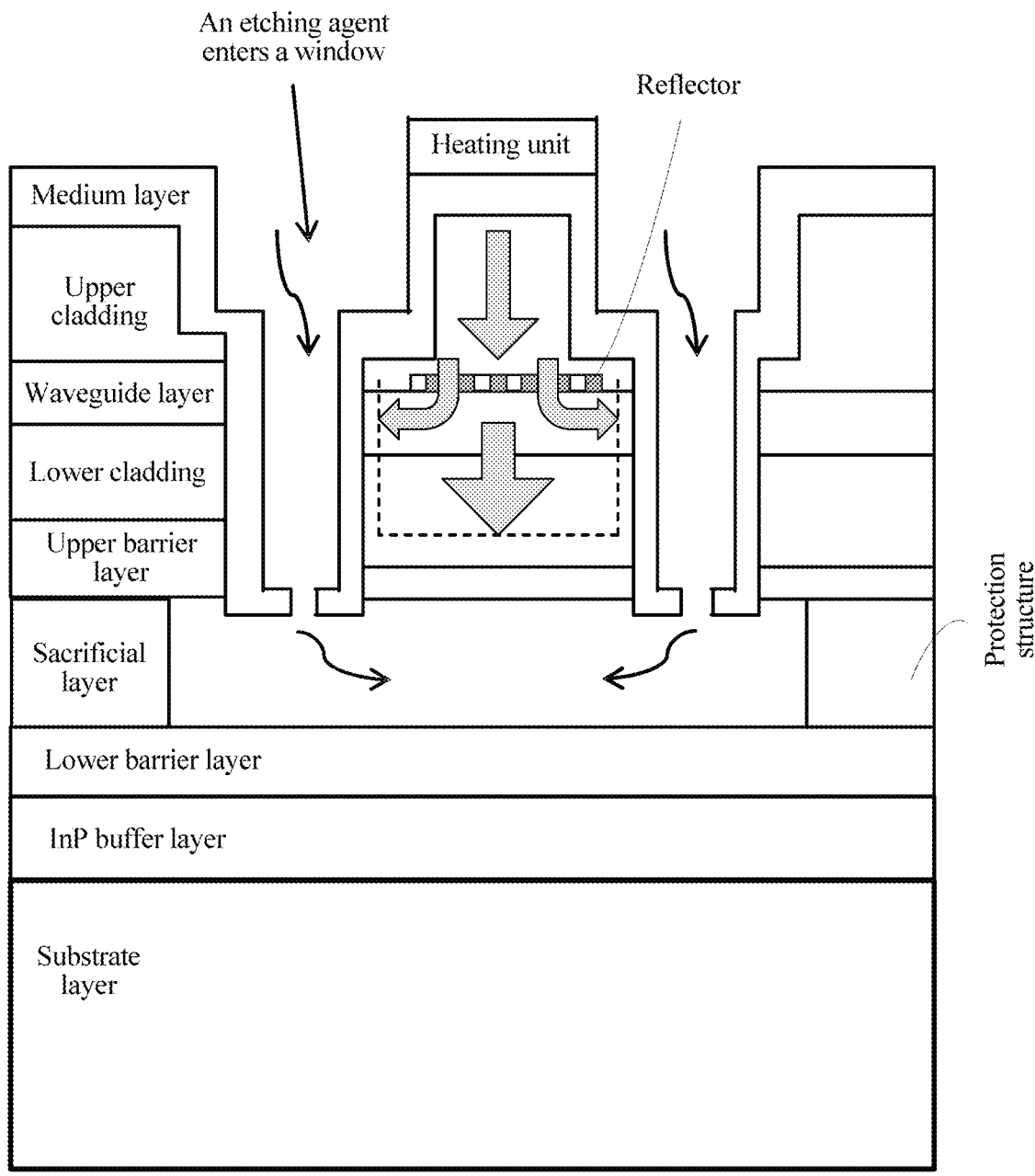
FIG. 16 is a sectional view of a tunable laser along a location 1-1 in FIG. 14 according to an embodiment of this application.
Figure 17:
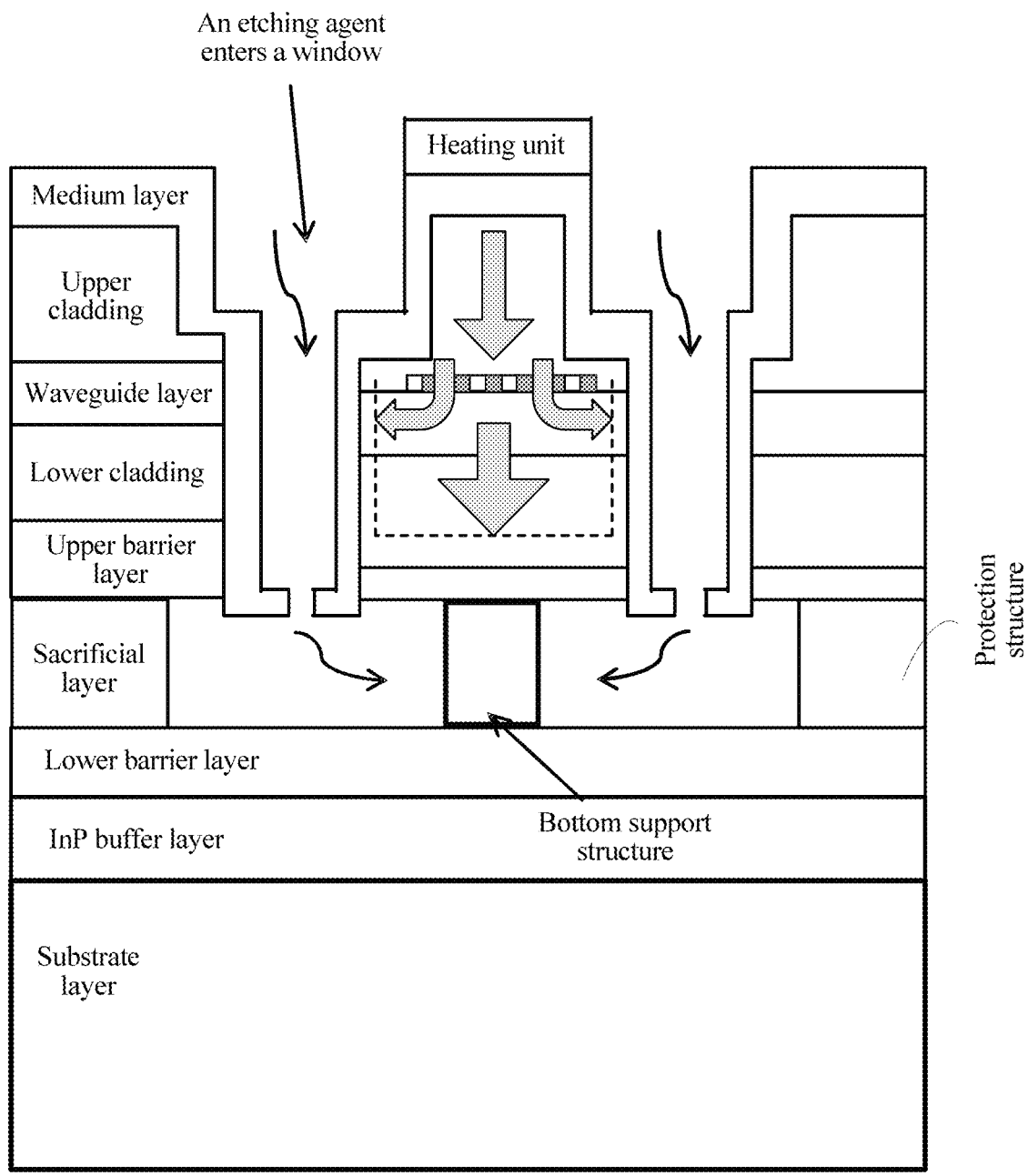
FIG. 17 is a sectional view of a tunable laser along a location 2-2 in FIG. 14 according to an embodiment of this application.

In another embodiment of this application, FIG. 14 is a top view of a bottom support structure included in a tunable laser according to an embodiment of this application. An etching agent enters through a void to etch the sacrificial layer, to generate a hollow structure. A transport layer part corresponding to the reflector is totally isolated from transport layer materials on two sides to generate voids, after extending through the upper cladding, the waveguide layer, the lower cladding, and the upper barrier layer, the voids reach a region in which the hollow structure is located, and a suspended structure is formed between the voids and above the hollow structure. The sacrificial layer below the suspended structure is not totally corroded, the bottom support structure is retained in the sacrificial layer, and the bottom support structure is used to support the suspended structure. The reflection region in the tunable laser may perform thermal tuning using the suspended structure, to improve thermal tuning efficiency of the super structure grating. FIG. 14 is a principle diagram of the reflection region having the suspended structure, and FIG. 15 is a sectional view of a tunable laser along a location 3-3 in FIG. 14 according to an embodiment of this application. It may be learned from a section at the location 3-3 in FIG. 14 that, an uncorroded region provides the bottom support structure. FIG. 16 is a sectional view of a tunable laser along a location 1-1 in FIG. 14 according to an embodiment of this application. FIG. 16 is similar to FIG. 13. FIG. 17 is a sectional view of a tunable laser along a location 2-2 in FIG. 14 according to an embodiment of this application. The sacrificial layer in the tunable laser is not totally etched, and the bottom support structure is retained in order to provide bottom support for the hollow structure.

As shown in FIG. 14, there are some periodic dashed-line boxes on two sides of an optical waveguide. Regions in the dashed-line boxes are windows used to etch a sacrificial layer material in a production process. An etching agent is used to separately etch a sacrificial layer material below the reflector using windows on two sides of the reflector, to generate a suspended structure. A difference from the embodiment in FIG. 11 is that the lateral mechanical support is provided for the suspended structure using the lateral support structure in FIG. 11. As shown in FIG. 17, the sacrificial layer below the suspended structure in this embodiment is not totally corroded, and therefore some columns are formed. In this embodiment, the columns at the bottom of the suspended structure are used to provide bottom support for the suspended structure.

A length period of the bottom support structure in a waveguide direction is not equal to a period of a modulation function of the super structure grating, to prevent the reflection spectrum of the super structure grating from being less flat during thermal tuning, and avoid deterioration of performance of the tunable laser.

That the length period of the bottom support structure in the waveguide direction is not equal to the period of the modulation function of the super structure grating may specifically include the following case. the bottom support structure and any particular wave peak or any particular wave valley in the spatial period of the modulation function of the super structure grating are staggered such that reflection flatness of the super structure grating can be improved. The wave peak in the spatial period of the modulation function is a maximum value in the spatial period of the modulation function, and the wave valley in the spatial period of the modulation function is a minimum value in the spatial period of the modulation function.

In an embodiment of this application, the super structure grating is located in a lower part of the upper cladding in a transport layer part corresponding to the reflector, or the super structure grating is located in an upper part of the lower cladding in a transport layer part corresponding to the reflector, or the super structure grating is located in the waveguide layer in a transport layer part corresponding to the reflector, or the super structure grating is partially located in each of the upper cladding and the waveguide layer in a transport layer part corresponding to the reflector, or the super structure grating is partially located in each of the lower cladding and the waveguide layer in a transport layer part corresponding to the reflector.

In FIG. 12 and FIG. 13, the reflector is located in the upper cladding, and is configured to tune a wavelength of the optical signal. Optionally, the reflector may be located in the lower cladding, or the waveguide layer, or the upper cladding and the waveguide layer, or the lower cladding and the waveguide layer. There are a plurality of specific implementations. This is for description only. The optical signal is propagated in the upper cladding, the lower cladding, and the waveguide layer, and the optical signal can be reflected only when the super structure grating is located at these locations.

In an embodiment of this application, a refractive index of the waveguide layer is greater than a refractive index of the upper cladding and a refractive index of the lower cladding. Therefore, total reflection occurs when the optical signal is propagated in the waveguide layer. In this way, as much photon energy as possible can be confined in the waveguide layer such that the waveguide layer can provide a low-loss propagation channel for the optical signal, to reduce losses of optical signal propagation.

For the tunable laser provided in the embodiments of this application, the reflectivity of the reflection peak of the grating determines features such as a threshold and output power of the tunable laser. The FWHM of the reflection peak of the grating determines a mode selection feature (the FWHM defines an acutance of the reflection peak) of the laser. Theoretically, a smaller FWHM indicates a larger side mode suppression ratio. A relatively ideal manner is separately optimizing the reflectivity and the FWHM. The embodiments of this application provide the super structure grating on which three-level discretization or even higher-level discretization is performed. The reflectivity and the FWHM of the reflection peak are separately optimized by adjusting the length of the grating and the ratio of the length of the optical waveguide corresponding to the modulation function discrete value to the total grating length of the super structure grating. In this way, the threshold of the laser, the output power, and the side mode suppression ratio of the laser can all become optimal. The embodiments of this application also provide a plurality of tunable lasers that are based on a grating on which high-level discretization is performed, and a reflector structure that improves thermal tuning efficiency of the grating on which high-level discretization is performed. The sacrificial layer is etched to generate the suspended structure to improve the thermal tuning efficiency. The bottom support structure is used to provide mechanical support for the suspended structure in order to ensure a fixed location of the suspended structure in the tunable laser.

What is claimed is:

1. A super structure grating apparatus, comprising:
a first reflector; and
a second reflector coupled to the first reflector, wherein the first reflector, the second reflector, or both the first reflector and the second reflector include a super structure grating configured to:
spatially perform amplitude and phase modulation on a uniform grating using a modulation function to generate a comb reflection spectrum, wherein the modulation function corresponds to (N+1) modulation function discrete values when discretization processing is performed on the modulation function using N thresholds, wherein N is a positive integer greater than or equal to 2, wherein each of the (N+1) modulation function discrete values corresponds to one section of an optical waveguide whose refractive index is uniform or corresponds to one section of the uniform grating, wherein the uniform grating is an optical waveguide alternating between a high refractive index and a low refractive index, wherein a reflectivity of a reflection peak of the super structure grating is based on a relationship of a ratio of a length of an optical waveguide corresponding to at least one of the (N+1) modulation function discrete values to a total grating length of the super structure grating, and based on the total grating length of the super structure grating, and wherein a full width half maximum (FWHM) of the reflection peak of the super structure grating is based on the ratio and the total grating length of the super structure grating.

2. The super structure grating apparatus of claim 1, wherein when N is 2, the modulation function corresponds to three modulation function discrete values, wherein one of the three modulation function discrete values corresponds to one section of optical waveguide whose refractive index is uniform, and wherein each of the other two of the three modulation function discrete values corresponds to one section of the uniform grating.

3. The super structure grating apparatus of claim 1, wherein two of the (N+1) modulation function discrete values correspond to a same type of the uniform grating.

4. The super structure grating apparatus of claim 1, further comprising optical waveguides, wherein a phase shift is included between the optical waveguides when signs of adjacent modulation function discrete values are different or one of the adjacent modulation function discrete values is zero, wherein the optical waveguides respectively correspond to the adjacent modulation function discrete values.

5. The super structure grating apparatus of claim 1, wherein both the first reflector and the second reflector include the super structure grating.

6. The super structure grating apparatus of claim 1, wherein the first reflector and the second reflector are located in a reflection region of a laser.

7. A tunable laser, comprising:
a reflection region comprising a super structure grating and configured to tune an optical signal using the super structure grating, wherein the super structure grating is configured to:
spatially perform amplitude and phase modulation on a uniform grating using a modulation function to generate a comb reflection spectrum, wherein the modulation function corresponds to (N+1) modulation function discrete values when discretization processing is performed on the modulation function using N thresholds, wherein N is a positive integer greater than or equal to 2, wherein each of the (N+1) modulation function discrete values corresponds to one section of an optical waveguide whose refractive index is uniform or corresponds to one section of the uniform grating, wherein the uniform grating is an optical waveguide alternating between a high refractive index and a low refractive index, wherein a reflectivity of a reflection peak of the super structure grating is based on a relationship of a ratio of a length of an optical waveguide corresponding to at least one of the (N+1) modulation function discrete values to a total grating length of the super structure grating, and based on the total grating length of the super structure grating, and wherein a full width half maximum (FWHM) of the reflection peak of the super structure grating is based on the ratio and the total grating length of the super structure grating.

8. The tunable laser according to claim 7, wherein the reflection region comprises a first reflector and a second reflector, and wherein the tunable laser further comprises:
the optical waveguide;
a gain region configured to generate an optical signal; and
a phase region cascaded to the gain region and the second reflector configured to perform a phase adjustment on the optical signal so that the tunable laser can perform fine tuning on a lasing wavelength of the optical signal, wherein the gain region is cascaded to the first reflector and the phase region using the optical waveguide.

9. The tunable laser of claim 8, wherein the tunable laser further comprises:
a semiconductor optical amplifier (SOA) cascaded to the first reflector using a first optical waveguide and configured to amplify power of the optical signal; and
a photodetector (PD) cascaded to the second reflector using a second optical waveguide and configured to either monitor or attenuate the power of the optical signal.

10. The tunable laser of claim 8, further comprising:
a first semiconductor optical amplifier (SOA) cascaded to the first reflector using a first optical waveguide and configured to amplify power of a first optical signal reflected by the first reflector; and
a second SOA cascaded to the second reflector using a second optical waveguide and configured to amplify power of a second optical signal reflected by the second reflector.

11. The tunable laser of claim 7, wherein the reflection region comprises a first reflector and a second reflector, and wherein the tunable laser further comprises:
a multimode interface (MMI) coupler cascaded to the first reflector and the second reflector;
a gain region configured to generate the optical signal; and
a phase region cascaded to the MMI and the gain region and configured to adjust a phase of the optical signal to fine tune a lasing wavelength of the optical signal.

12. The tunable laser of claim 11, further comprising a phase adjuster coupled to the MMI coupler and either the first reflector or the second reflector, wherein the phase adjuster is configured to match a first phase of a first reflection spectrum of the first reflector and a second phase of a second reflection spectrum of the second reflector.

13. The tunable laser of claim 11, wherein the first reflector comprises a first port, the second reflector comprises a second port and the gain region comprises a third port, wherein the tunable laser further comprises:
an SOA configured to amplify power of the optical signal, and
a PD configured to either monitor or attenuate the power of the optical signal,
wherein the first port is connected to the SOA or the PD, the second port is connected to the SOA or the PD, or the third port is connected to the SOA or the PD.

14. The tunable laser of claim 7, wherein the reflection region comprises:
a substrate layer;
a lower barrier layer located above the substrate layer;
a sacrificial layer located above the lower barrier layer and comprising a protection structure formed in the sacrificial layer, wherein the protection structure and an inter-layer region form a hollow structure;
an upper barrier layer located above the sacrificial layer;
a transport layer located above the upper barrier layer and comprising an upper cladding, a waveguide layer below the upper cladding, and a lower cladding below the waveguide layer, wherein the inter-layer region comprises a region between the transport layer and the lower barrier layer;

a reflector located in the transport layer and configured to tune the optical signal using the super structure grating; and a heater located above the transport layer.

15. The tunable laser of claim 14, wherein the hollow structure is totally hollow, wherein the tunable laser further comprises:

voids between a transport layer part corresponding to the reflector and transport layer materials on two sides;

a suspended structure formed between the voids and above the hollow structure, wherein the voids are periodically arranged in a waveguide direction, and wherein after extending through the upper cladding, the waveguide layer, the lower cladding, and the upper barrier layer, the voids reach a region in which the hollow structure is located; and a support structure between the voids that are adjacent, wherein the support structure provides lateral mechanical support for the suspended structure, wherein a length period of the support structure in the waveguide direction is not equal to a period of the modulation function of the super structure grating.

16. The tunable laser of claim 14, wherein the tunable laser further comprises:

voids, wherein a transport layer part corresponding to the reflector is totally isolated from the transport layer on two sides to generate the voids, wherein after extending through the upper cladding, the waveguide layer, the lower cladding, and the upper barrier layer, the voids reach a region in which the hollow structure is located;

a suspended structure formed above the hollow structure and between the voids, wherein a bottom of the sacrificial layer is not totally corroded; and a bottom support structure retained in the sacrificial layer, wherein the bottom support structure provides support for the suspended structure.

17. The tunable laser of claim 16, wherein a length period of the bottom support structure in a waveguide direction is not equal to a period of the modulation function of the super structure grating.

18. The tunable laser of claim 14, wherein the super structure grating is located in a lower part of the upper cladding in the transport layer corresponding to the reflector; located in an upper part of the lower cladding in the transport layer; located in the waveguide layer corresponding to the reflector; partially located in each of the upper cladding and the waveguide layer in the transport layer; or partially located in each of the lower cladding and the waveguide layer in the transport layer.

19. The tunable laser of claim 14, wherein a first refractive index of the waveguide layer is greater than a second refractive index of the upper cladding and a third refractive index of the lower cladding.

20. The tunable laser of claim 14, wherein the reflection region further comprises an indium phosphide (InP) buffer layer, wherein the lower barrier layer is located between the sacrificial layer and the InP buffer layer, and wherein the InP buffer layer is located between the lower barrier layer and the substrate layer.

* * * * *